(12) United States Patent
Yamada et al.

(10) Patent No.: US 10,001,774 B2
(45) Date of Patent: Jun. 19, 2018

(54) MANUFACTURING SUPPORTING SYSTEM, MANUFACTURING SUPPORTING METHOD, AND MANUFACTURING SUPPORTING PROGRAM FOR ELECTRONIC DEVICE

(71) Applicant: KABUSHIKI KAISHA TOSHIBA, Minato-ku (JP)

(72) Inventors: Muneyoshi Yamada, Yokkaichi (JP); Akira Soga, Kita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 341 days.

(21) Appl. No.: 14/772,170

(22) PCT Filed: Feb. 25, 2014

(86) PCT No.: PCT/JP2014/054518
§ 371 (c)(1),
(2) Date: Sep. 2, 2015

(87) PCT Pub. No.: WO2014/148210
PCT Pub. Date: Sep. 25, 2014

(65) Prior Publication Data
US 2016/0011589 A1    Jan. 14, 2016

(30) Foreign Application Priority Data

Mar. 22, 2013    (JP) ................................ 2013-061152

(51) Int. Cl.
*G06F 19/00*    (2018.01)
*G05B 13/02*    (2006.01)
(Continued)

(52) U.S. Cl.
CPC ........ *G05B 19/41875* (2013.01); *H01L 22/20* (2013.01); *G05B 2219/37224* (2013.01);
(Continued)

(58) Field of Classification Search
CPC ................................. G05B 19/41875
(Continued)

(56) References Cited

U.S. PATENT DOCUMENTS 6,295,478 B1 * 9/2001 Inada ............... G05B 19/41875
700/109
6,505,090 B1 * 1/2003 Harakawa ......... H01L 21/67253
257/E21.525

(Continued)

FOREIGN PATENT DOCUMENTS

JP    2002-353084 A    12/2002
JP    2003-332209 A    11/2003
(Continued)

OTHER PUBLICATIONS

International Preliminary Report on Patentability and Written Opinion dated Oct. 1, 2015 in PCT/JP2014/054518 filed Feb. 25, 2014 (submitting English translation only).
(Continued)

*Primary Examiner* — Suresh Suryawanshi
(74) *Attorney, Agent, or Firm* — Oblon, McClelland, Maier & Neustadt, L.L.P.

(57) ABSTRACT

There is provided a manufacturing supporting system for an electronic device including an inspection-data acquiring unit, a fluctuation-by-classification calculating unit, a data-by-factor acquiring unit, and a fluctuation-by-factor calculating unit is provided. The inspection-data acquiring unit acquires an inspection data of a target electronic device. The fluctuation-by-classification calculating unit is configured to calculate, on the basis of the inspection data, by classification including at least any one of positions among lots, among substrates, and in a substrate plane of the electronic device, fluctuation in dimensions of the target electronic device. The data-by-factor acquiring unit acquires an improvement history data of the target electronic device.

(Continued)

The fluctuation-by-factor calculating unit is configured to determine a plurality of fluctuation factors of the target electronic device on the basis of information concerning the plurality of fluctuation factors included in the improvement history data of the target electronic device, and calculate fluctuation in dimensions by the determined plurality of fluctuation factors. Thereby, there is provided a manufacturing supporting system, a manufacturing supporting method, and a manufacturing supporting program for an electronic device that support determination of an improvement measure for manufacturing conditions.

20 Claims, 14 Drawing Sheets

(51) Int. Cl.
G05B 19/418 (2006.01)
H01L 21/66 (2006.01)
(52) U.S. Cl.
CPC .............. H01L 22/12 (2013.01); Y02P 90/18 (2015.11); Y02P 90/20 (2015.11); Y02P 90/22 (2015.11)
(58) Field of Classification Search
USPC ........................................................ 700/110
See application file for complete search history.

(56) References Cited

U.S. PATENT DOCUMENTS 6,954,883 B1* 10/2005 Coss, Jr. .......... G05B 19/41875
700/121
7,739,631 B2* 6/2010 Teramoto ......... G01R 31/31707
324/537
2009/0177308 A1 7/2009 Inokawa et al.
2012/0239179 A1* 9/2012 Hanawa ................. G06Q 10/06
700/109

FOREIGN PATENT DOCUMENTS

| JP | 2005-317984 A | 11/2005 |
| JP | 2009-170502 A | 7/2009 |
| JP | 2011-3603 A | 1/2011 |
| JP | 2011198300 A * | 10/2011 |
| TW | 200512794 A | 4/2005 |
| TW | 200530583 A | 9/2005 |
| TW | I280603 B | 5/2007 |
| TW | 200813879 A | 3/2008 |
| TW | 201036082 A1 | 10/2010 |
| TW | 201118776 A1 | 6/2011 |
| WO | WO 2012/137775 A1 | 10/2012 |

OTHER PUBLICATIONS

Combined Chinese Office Action and Search Report dated Oct. 28, 2016 in Patent Application No. 201480013303.5 (with English language translation).
International Search Report dated Apr. 15, 2014 in PCT/JP2014/054518.
Combined Office Action and Search Report dated Aug. 13, 2015 in Taiwanese Patent Application No. 103107721 (with English language translation).
Office Action dated Sep. 13, 2016 in Japanese Patent Application No. 2013-061152 (with English language translation).

* cited by examiner $$\sigma_{all}^2 = \underbrace{\frac{1}{\text{NUMBER OF WAFERS}} \sum_{h,i} \sigma_{DEVICE,i,h}^2}_{\text{IN-PLANE FLUCTUATION}} + \underbrace{\frac{1}{\text{NUMBER OF LOTS}} \sum_h \sigma_{WAFER,h}^2}_{\substack{\text{FLUCTUATION} \\ \text{AMONG WAFERS}}} + \underbrace{\sigma_{LOT}^2}_{\substack{\text{FLUCTUATION} \\ \text{AMONG LOTS}}} \quad \cdots (1)$$

$$\sigma_{DEVICE,i,h}^2 = \frac{1}{\text{NUMBER OF DEVICES}} \sum_j (x_{h,i,j} - \overline{x_{h,i}})^2 \quad \cdots (2)$$

$$\sigma_{WAFER,h}^2 = \frac{1}{\text{NUMBER OF WAFERS}} \sum_i (\overline{x_{h,i}} - \overline{x_h})^2 \quad \cdots (3)$$

$$\sigma_{LOT}^2 = \frac{1}{\text{NUMBER OF LOTS}} \sum_h (\overline{x_h} - \overline{x})^2 \quad \cdots (4)$$

$$\overline{x_{h,i}} = \frac{1}{\text{NUMBER OF DEVICES}} \sum_j x_{h,i,j} \quad \cdots (5)$$

$$\overline{x_h} = \frac{1}{(\text{NUMBER OF DEVICES} \times \text{NUMBER OF WAFERS}) @ \text{LOT}} \sum_{i,j} x_{h,i,j} \quad \cdots (6)$$

FIG. 4

FIG. 11
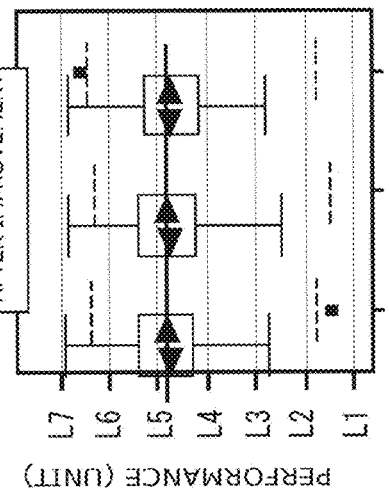
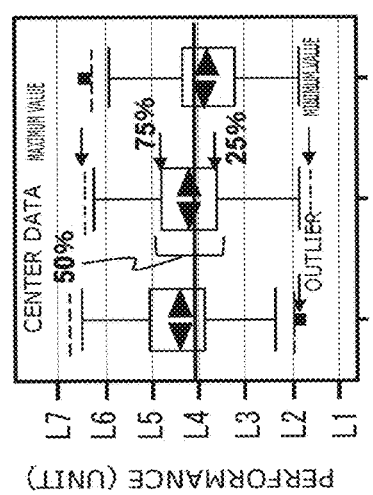

MANUFACTURING SUPPORTING SYSTEM, MANUFACTURING SUPPORTING METHOD, AND MANUFACTURING SUPPORTING PROGRAM FOR ELECTRONIC DEVICE

TECHNICAL FIELD

This invention relates to a manufacturing supporting system, a manufacturing supporting method, and a manufacturing supporting program for electronic device.

BACKGROUND ART

There are electronic devices such as a semiconductor device, a magnetic device, and MEMS (Micro Electro Mechanical Systems). In manufacturing of the electronic devices, according to refining, there is a demand for stricter dimension management. Therefore, in the manufacturing of the electronic devices, an improvement measure for manufacturing conditions is planned and setting of machining conditions of a manufacturing apparatus is corrected on the basis of measurement values in an inspection process.

An improvement measure to be actually implemented is determined on the basis of a trial calculation of cost effectiveness of a technician having expertise. However, in the planning of the improvement measure and the trial calculation of the cost effectiveness by manual work of a technician, for example, the planning and the trial calculation take a long time, calculation mistakes often occur, the planning and the trial calculation cannot be implemented without expertise and skills, and only an improvement measure in a manufacturing process in which the technician has expertise can be planned. Under the present situation, advanced expertise is necessary for determination of the improvement measure. Even the technician having expertise takes time to determine the improvement measure. Therefore, in the manufacturing of the electronic device, it is desired to make it possible to easily and appropriately determine an improvement measure for manufacturing conditions.

CITATION LIST

Patent Literature

[PTL 1]
JP-A 2009-170502(Kokai)

SUMMARY OF INVENTION

Technical Problem

An embodiment of the invention provides a manufacturing supporting system, a manufacturing supporting method, and a manufacturing supporting program for an electronic device that support determination of an improvement measure for manufacturing conditions.

Solution to Problem

According to an embodiment of the invention, a manufacturing supporting system for an electronic device including an inspection-data acquiring unit, a fluctuation-by-classification calculating unit, a data-by-factor acquiring unit, and a fluctuation-by-factor calculating unit is provided. The inspection-data acquiring unit is configured to acquire, on the basis of specific information for specifying a target electronic device, from an inspection database that stores a plurality of inspection data including information concerning dimensions acquired in an inspection process and the specific information, the inspection data of the target electronic device. The fluctuation-by-classification calculating unit is configured to calculate, on the basis of the inspection data of the target electronic device, by classification including at least any one of positions among lots, among substrates, and in a substrate plane of the electronic device, fluctuation in dimensions of the target electronic device. The data-by-factor acquiring unit is configured to acquire, from a knowledge database that stores a plurality of improvement history data including information concerning a type of the electronic device, information concerning a manufacturing process in the type, information concerning fluctuation factors of a plurality of dimensions planned in past by the classification for the manufacturing process, and information concerning a plurality of improvement measures for each of the fluctuation factors, the improvement history data of the target electronic device on the basis of the specific information. The fluctuation-by-factor calculating unit is configured to determine a plurality of fluctuation factors of the target electronic device on the basis of information concerning the plurality of fluctuation factors included in the improvement history data of the target electronic device, calculate fluctuation in dimensions by the determined plurality of fluctuation factors, and determine a plurality of improvement measures for the target electronic device on the basis of the information concerning the plurality of improvement measures included in the improvement history data.

BRIEF DESCRIPTION OF DRAWINGS

FIG. 4 is a schematic view showing an example of a calculation formula for fluctuation of the fluctuation-by-classification calculating unit according to the embodiment.

FIG. 11 is a schematic view showing an example of an output screen according to the embodiment.

DESCRIPTION OF EMBODIMENTS

Figure 1:
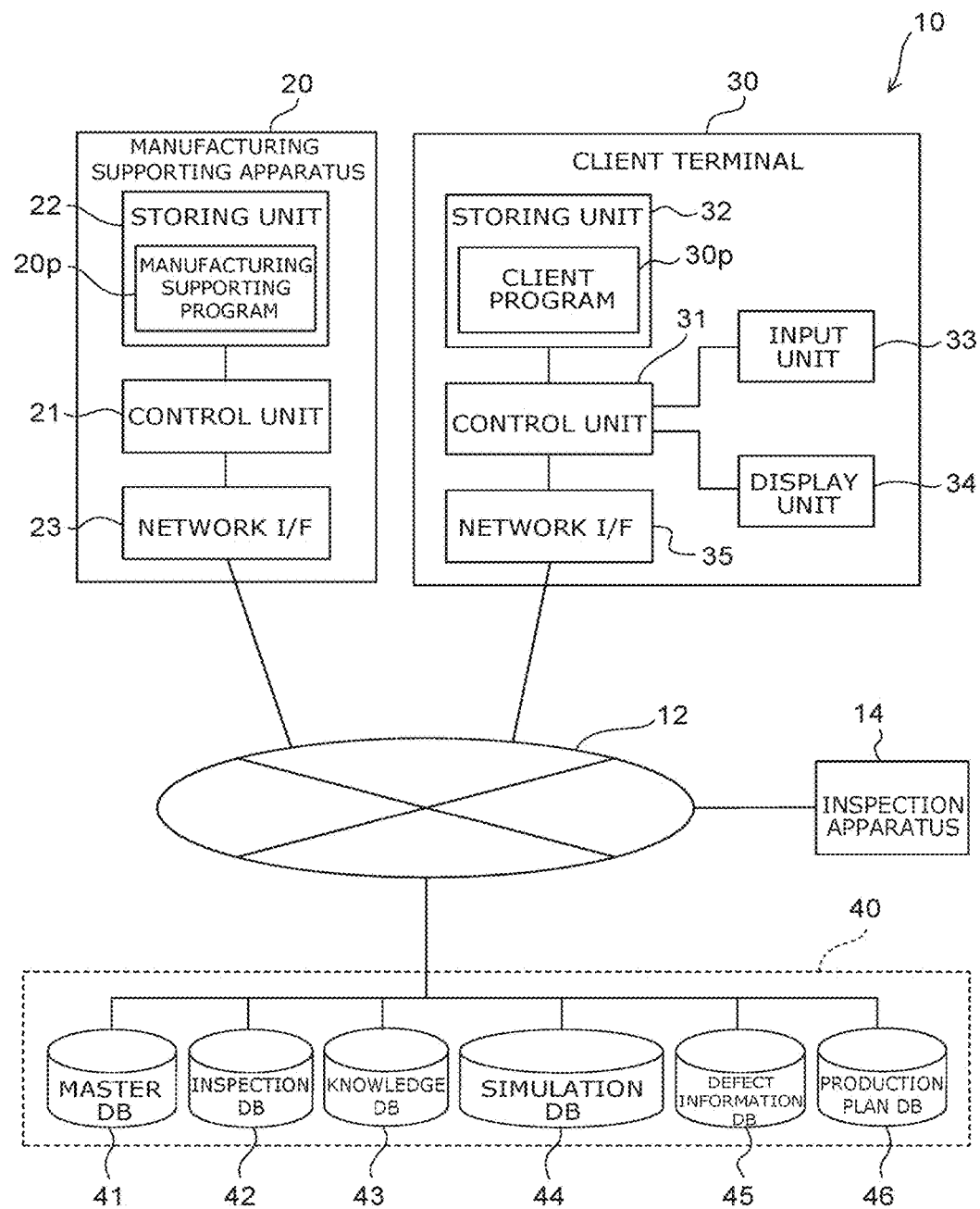
FIG. 1 is a schematic block diagram showing a manufacturing supporting system according to an embodiment.

Embodiments are described below with reference to the drawings.

Note that, the drawings are schematic or conceptual. Relations between thicknesses and widths of portions, ratios of sizes among the portions, and the like are not always the same as real ones. Even when the same portions are shown, the portions are sometimes shown in different dimensions and ratios depending on the drawings.

Note that in the specification and the drawings, components described with reference to the drawings already referred to are denoted by the same reference numerals and signs. Detailed description of the components is omitted as appropriate.

FIG. 1 is a schematic block diagram showing a manufacturing supporting system according to an embodiment.

As shown in FIG. 1, a manufacturing supporting system 10 includes, for example, a manufacturing supporting apparatus 20 and a client terminal 30. The manufacturing supporting apparatus 20 and the client terminal 30 are connected to each other via a network 12. That is, the manufacturing supporting apparatus 20 and the client terminal 30 can perform communication with each other via the network 12.

The manufacturing supporting system 10 is a system that supports decision making of improvement of a manufacturing process for an electronic device such as a semiconductor device or a magnetic device. More specifically, the manufacturing supporting system 10 supports decision making of improvement of a manufacturing process for an electronic device for treating a plurality of substrates as one lot and disposing and forming a plurality of devices on the substrates. In the following description, the semiconductor device is described as an example. In the semiconductor device, a wafer is used as a substrate. In an example described below, twenty-five wafers are treated as one lot and a plurality of semiconductor devices are formed on the wafers.

In the manufacturing supporting system 10, a user accesses the manufacturing supporting apparatus 20 from the client terminal 30. The user inputs specific information for specifying a target semiconductor device to the manufacturing supporting apparatus 20 via the client terminal 30. In the example, the user inputs information related to manufacturing of a desired semiconductor device (hereinafter referred to as manufacturing information) as the specific information. The manufacturing information includes information such as a type (a product name) of the semiconductor device, a manufacturing process for the semiconductor device, an inspection apparatus used for inspection of the semiconductor device, and a period in which the semiconductor device is manufactured. The manufacturing information is not limited to these kinds of information and may include other kinds of information. The specific information is not limited to the manufacturing information and may be, for example, an identification number given to each semiconductor device.

The manufacturing supporting apparatus 20 analyzes fluctuation in dimensions of the semiconductor device on the basis of the input manufacturing information. The manufacturing supporting apparatus 20 finds an effective improvement measure on the basis of information concerning improvement measures implemented in the past and performs a trial calculation of effects expected when the improvement measure is implemented. The manufacturing supporting apparatus 20 outputs, for example, information concerning the found improvement measure and a trial calculation result of the effects to the client terminal 30.

The client terminal 30 displays the information output from the manufacturing supporting apparatus 20. The user determines, on the basis of the improvement measure, the trial calculation result of the effects, and the like displayed by the client terminal 30, an improvement measure to be actually implemented. Consequently, the manufacturing supporting system 10 can support decision making of an improvement measure for the manufacturing process. In this way, the manufacturing supporting system 10 executes processing for supporting decision making of an improvement measure for the manufacturing process for the electronic device (hereinafter referred to as decision making supporting processing).

For example, the network 12 may be a network that connects a specific area such as a LAN (Local Area Network) or may be a public network such as the Internet.

The manufacturing supporting apparatus 20 includes, for example, a control unit 21, a storing unit 22, and a network interface 23 (hereinafter referred to as network I/F 23).

For example, the control unit 21 is a processor such as a CPU (Central Processing Unit) or a MPU (Micro-Processing Unit).

In the storing unit 22, a manufacturing supporting program 20p for executing decision making supporting processing is stored. The storing unit 22 includes, for example, a ROM region where various computer programs such as the manufacturing supporting program 20p and data are stored and a RAM region where various data generated in a process of control are temporarily stored. The control unit 21 reads out the various computer programs from the storing unit 22 and sequentially processes the computer programs to thereby collectively control the units of the manufacturing supporting apparatus 20. As the storing unit 22, for example, storage devices such as a ROM (Read Only Memory), a RAM (Random Access Memory), and a hard disk are used. For example, the storing unit 22 may be configured by combining the storage devices.

The network I/F 23 connects the manufacturing supporting apparatus 20 to the network 12. The network I/F 23 is electrically connected to the control unit 21. For example, the control unit 21 is connected to the network 12 via the network I/F 23. The network I/F 23 is, for example, a modem or a router. As the network I/F 23, a device conforming to the standard of the network 12 is used.

The manufacturing supporting apparatus 20 is, for example, an application server. For example, the manufacturing supporting apparatus 20 may be one server or may be a server farm obtained by combining a plurality of servers.

The client terminal 30 includes, for example, a control unit 31, a storing unit 32, an input unit 33, a display unit 34, and a network interface 35 (network I/F 35).

Like the control unit 21 of the manufacturing supporting apparatus 20, for example, the control unit 31 is a processor such as a CPU or a MPU. The network I/F 35 connects the client terminal 30 to the network 12. Since the network I/F 35 is the same as the network I/F 23 of the manufacturing supporting apparatus 20, detailed description of the network I/F 35 is omitted.

As the input unit 33, a keyboard, a mouse, or the like is used. The input unit 33 may be, for example, any input device that can input information and an instruction to the control unit 31. As the display unit 34, a liquid crystal display or the like is used. The display unit 34 may be, for example, any display device that can display a screen corresponding to control of the control unit 31.

In the storing unit 32, a client program 30p corresponding to the manufacturing supporting system 10 is stored. The storing unit 32 includes, for example, a ROM region where various computer programs such as the client program 30p and data are stored and a RAM region where various data generated in a process of control are temporarily stored. The control unit 31 reads out the various computer programs from the storing unit 32 and sequentially processes the computer programs to thereby collectively control the units of the client terminal 30. As the storing unit 32, for example, various storage devices such as a ROM, a RAM, and a hard disk are used. For example, the storing unit 32 may be configured by combining the storage devices.

For example, the client program 30p may be a dedicated computer program corresponding to the manufacturing supporting system 10 or may be a general purpose web browser or the like. The client program 30p only has to be capable of executing, for example, processing for receiving inputs of information and an instruction from the input unit 33, processing for accessing the manufacturing supporting apparatus 20 in response to an input instruction, and processing for displaying various screens corresponding to a result of the access and the like on the display unit 34.

The client terminal 30 is, for example, a personal computer. The client terminal 30 may be, for example, a terminal designed exclusively for the manufacturing supporting system 10. The client terminal 30 may be, for example, a portable terminal such as a smart phone or a tablet computer. The client terminal 30 may be connected to the network 12 by wire or may be connected to the network 12 by radio.

Note that, in the example, one client terminal 30 is shown. However, the manufacturing supporting system 10 may include a plurality of client terminals 30. Each of the plurality of client terminals 30 may be capable of accessing the manufacturing supporting apparatus 20.

A database (DB) group 40 is connected to the network 12. In the DB group 40, for example, a master DB 41, an inspection DB 42, a knowledge DB 43, a simulation DB 44, a defect information DB 45, and a production plan DB 46 are provided. The DBs 41 to 46 may be respectively provided in individual servers or may be provided in one server. Databases connected to the network 12 are not limited to these databases. Other databases may be further connected to the network 12.

In the master DB 41, for example, manufacturing information such as information concerning a type (a product name) of a semiconductor device, information concerning an implemented manufacturing process, information concerning a measurement device used for inspection, information concerning a manufacturing date of the semiconductor device (a date when a target manufacturing process is implemented), information concerning the position of the semiconductor device in a plane of a wafer, a shipping date, a customer, and a generation are stored. The master DB 41 is used for, for example, before starting an analysis (estimation), selecting a target of the analysis (a product, a process, a period, etc.).

In the inspection DB 42, a plurality of inspection data acquired in an inspection process for a manufactured semiconductor device are stored. The inspection data includes, for example, information concerning dimensions after machining such as film formation and etching in a manufacturing apparatus. The inspection data includes, for example, manufacturing information such as information concerning a type (a product name) of a semiconductor device, information concerning an implemented manufacturing process, information concerning a measurement device used for inspection, information concerning a manufacturing date of the semiconductor device (a date when a target manufacturing process is implemented), and information concerning the position of the semiconductor device in a plane of a wafer. In the inspection data, these kinds of manufacturing information is stored in association with information concerning dimensions. Consequently, information concerning dimensions in each manufacturing process for a manufactured semiconductor device can be individually read out.

In the knowledge DB 43, a plurality of improvement history data are stored. With the improvement history data, for example, information concerning a type of a semiconductor device, information concerning a manufacturing process in the type, information concerning factors of fluctuation in a plurality of dimensions planned in the past by classification for the manufacturing process, information concerning a plurality of improvement measures for each of the fluctuation factors, information concerning improvement prospects of the plurality of dimensions expected when each of the improvement measures is implemented, and information concerning a plurality of man-hours consumed until each of the improvement measures is implemented are associated.

For example, an improvement measure is applied to a predetermined manufacturing process for a predetermined semiconductor device. In this case, by referring to improvement history data of the same manufacturing process of the knowledge DB 43, it is possible to learn fluctuation factors, improvement measures, and improvement prospects of the manufacturing process. For example, when a plurality of improvement history data for the same process are stored, by calculating an average of information concerning improvement prospects of the improvement history data or adopting information concerning improvement prospects of latest improvement history data, it is possible to obtain more appropriate improvement prospects.

In the simulation DB 44, for example, a result of a process simulation of a manufacturing process added anew in a semiconductor device of a product under development or the like is stored. For example, a process simulator may be provided in a server same as a server of the simulation DB 44. For example, the process simulation may be performed in response to an instruction or the like from the manufacturing supporting apparatus 20. A simulation result may be stored in the simulation DB 44 together with a response of a simulation result to the manufacturing supporting apparatus 20. The process simulator may be provided in, for example, a sever different from the server of the simulation DB 44. A result of the process simulation may be stored in advance in, for example, the simulation DB 44.

In the defect information DB 45, a plurality of defective rate data are stored. With the defective rate data, for example, information concerning a type of a semiconductor device, information concerning a manufacturing process in the type, and a correlation of dimensions and a defective rate (a yield) in the manufacturing process are associated.

In the production plan DB 46, a plurality of production plan data are stored. With the production plan data, for example, information concerning a type of a semiconductor device, information concerning a manufacturing process in the type, and information concerning expenses for implementing an improvement measure for fluctuation factors of the manufacturing process are associated.

For example, an inspection apparatus 14 is connected to the network 12. The inspection apparatus 14 performs, for example, inspection of dimensions in an inspection process for a semiconductor device. The inspection apparatus 14 outputs information concerning acquired dimensions to the inspection DB 42 as inspection data. The inspection DB 42 stores input inspection data. In the example, one inspection apparatus 14 is shown. However, actually, a plurality of inspection apparatuses 14 provided for each manufacturing line and each manufacturing process for a semiconductor device are connected to the network 12. Inspection data is output from each of the inspection apparatuses 14 to the inspection DB 42. Consequently, inspection data related to manufacturing processes of the semiconductor device is accumulated in the inspection DB 42. As the inspection apparatus 14, a three-dimensional measurement SEM (Scanning Electron Microscope) or the like is used.

Figure 2:
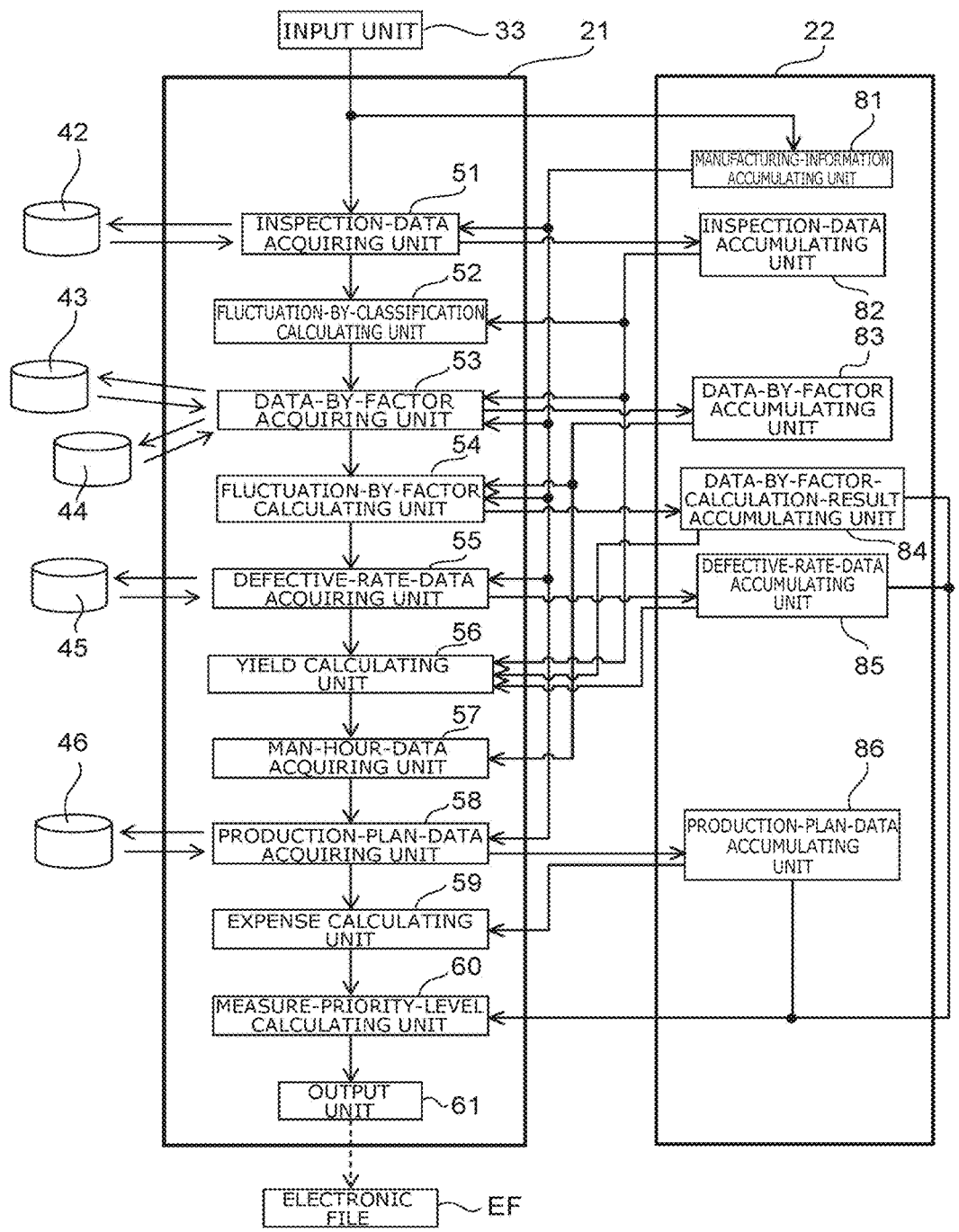
FIG. 2 is a functional block diagram schematically showing the control unit and the storing unit of the manufacturing supporting apparatus according to the embodiment.

FIG. 2 is a functional block diagram schematically showing the control unit and the storing unit of the manufacturing supporting apparatus according to the embodiment.

As shown in FIG. 2, in the control unit 21 of the manufacturing supporting apparatus 20, an inspection-data acquiring unit 51, a fluctuation-by-classification calculating unit 52, a data-by-factor acquiring unit 53, a fluctuation-by-factor calculating unit 54, a defective-rate-data acquiring unit 55, a yield calculating unit 56, a man-hour-data acquiring unit 57, a production-plan-data acquiring unit 58, an expense calculating unit 59, a measure-priority-level calculating unit 60, and an output unit 61 are provided. The units 51 to 61 are provided in the control unit 21 in a software manner by, for example, execution of the manufacturing supporting program 20p. For example, the units 51 to 61 may be provided in the control unit 21 in a hardware manner by a logic circuit or the like. In the example, the units 51 to 61 are provided in the control unit 21. However, for example, the units 51 to 61 may be provided separately in a plurality of processors or the like. The respective units 51 to 61 may be independent processors.

In the storing unit 22 of the manufacturing supporting apparatus 20, a manufacturing-information accumulating unit 81, an inspection-data accumulating unit 82, a data-by-factor accumulating unit 83, data-by-factor-calculation-result accumulating unit 84, a defective-rate-data accumulating unit 85, and a production-plan-data accumulating unit 86 are provided. The units 81 to 86 are, for example, memory spaces having predetermined capacities in the storing unit 22. The units 81 to 86 may be, for example, storage devices independent from one another.

Manufacturing information of a processing target semiconductor device is input to the inspection-data acquiring unit 51 and the manufacturing-information accumulating unit 81. The manufacturing information is input via the input unit 33 of the client terminal 30. The manufacturing-information accumulating unit 81 temporarily stores the input manufacturing information.

Figure 3:
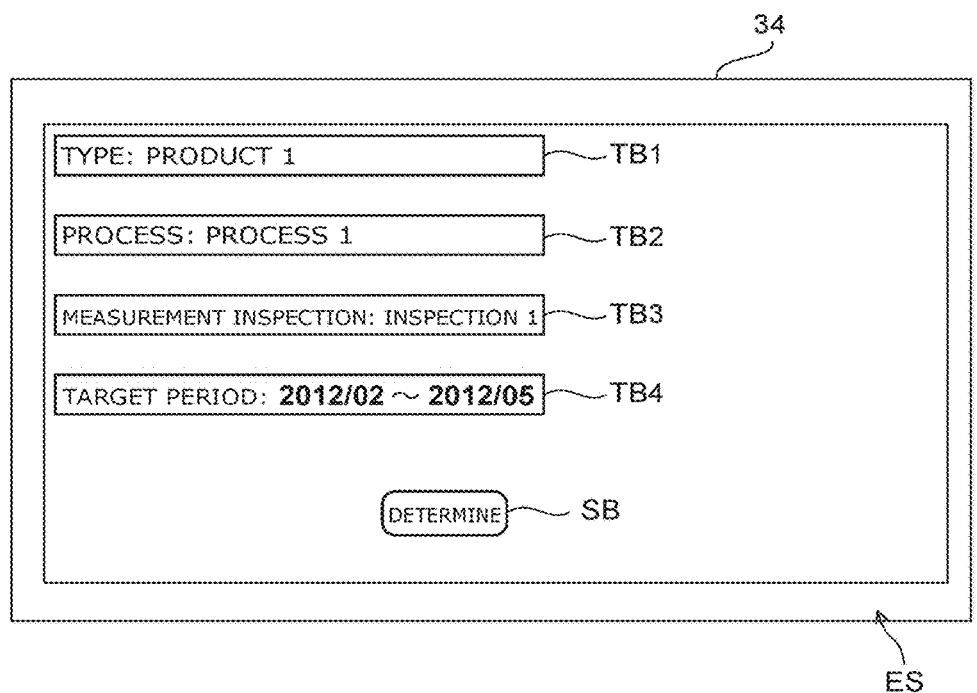
FIG. 3 is a schematic view showing an example of an input screen of the client terminal according to the embodiment.

FIG. 3 is a schematic view showing an example of an input screen of the client terminal according to the embodiment.

As shown in FIG. 3, in the client terminal 30, when the client program 30p is executed, an input screen ES is displayed on the display unit 34. On the input screen ES, for example, character input boxes for inputting manufacturing information are provided. On the input screen ES, for example, a character input box TB1 for inputting a type of a semiconductor device, a character input box TB2 for inputting a manufacturing process, a character input box TB3 for inputting an inspection apparatus used for an inspection process, and a character input box TB4 for inputting a target manufacturing period are provided. On the input screen ES, for example, a determination button SB for instructing determination of the input manufacturing information is provided. Note that the input of the manufacturing information may be able to be directly performed or may be able to be selected from a pull-down menu or the like.

For example, when the user desires to execute decision making supporting processing for a desired semiconductor device, the user operates the input unit 33 and instructs the control unit 31 of the client terminal 30 to execute the client program 30p. For example, the control unit 31 reads out the client program 30p in response to the instruction from the input unit 33 and executes the processing according to the client program 30p. For example, the control unit 31 causes the display unit 34 to display the input screen ES.

The user inputs, via the input unit 33, manufacturing information to the character input boxes TB1 to TB4 of the input screen ES displayed on the display unit 34. After the input, the user clicks the determination button SB. The control unit 31 transmits the input manufacturing information to the manufacturing supporting apparatus 20 in response to the click of the determination button SB.

When receiving the manufacturing information transmitted from the client terminal 30, the control unit 21 of the manufacturing supporting apparatus 20 inputs the manufacturing information to the inspection-data acquiring unit 51 and causes the manufacturing-information accumulating unit 81 of the storing unit 22 to store the manufacturing information. Consequently, the manufacturing information is input to the inspection-data acquiring unit 51 and the manufacturing-information accumulating unit 81.

The inspection-data acquiring unit 51 performs acquisition of inspection data. The inspection-data acquiring unit 51 accesses the inspection DB 42, for example, in response to the input of the manufacturing information and reads out inspection data corresponding to the manufacturing information from the inspection DB 42.

The inspection-data accumulating unit 82 temporarily stores the inspection data read out by the inspection-data acquiring unit 51. The inspection-data acquiring unit 51 causes the inspection-data accumulating unit 82 to store the inspection data read out from the inspection DB 42.

The fluctuation-by-classification calculating unit 52 calculates, on the basis of the inspection data stored in the inspection-data accumulating unit 82, by classification including at least any one of positions among lots, among wafers, and in a wafer plane, fluctuation in dimensions of a target semiconductor device. The dimensions include, for example, line width, depth of etching, and a hole diameter. In the following description, fluctuation in dimensions among lots of the target semiconductor device is referred to as inter-lot fluctuation. Fluctuation in dimensions among wafers of the target semiconductor device is referred to as inter-wafer fluctuation. Fluctuation in dimensions in a position in a wafer plane of the target semiconductor device is referred to as in-plane fluctuation.

For example, in a semiconductor device in which the inspection process is performed for only one of a plurality of devices on a wafer plane, the in-plane fluctuation is not included in classifications. For example, in a semiconductor device in which the inspection process is performed for only one of a plurality of wafers included in one lot, the inter-wafer fluctuation is not included in the classifications. In this way, at least any one of the inter-lot fluctuation, the inter-wafer fluctuation, and the in-plane fluctuation only has to be included in the classifications. In an example described below, each of the inter-lot fluctuation, the inter-wafer fluctuation, and the in-plane fluctuation is included in the classifications. Note that the classifications are not limited to the three classifications and may include other elements. For example, in some case, dimensions in a plurality of parts are inspected concerning one semiconductor device. In this case, the parts in the device may be included in the classifications.

FIG. 4 is a schematic view showing an example of a calculation formula for fluctuation of the fluctuation-by-classification calculating unit according to the embodiment.

The fluctuation-by-classification calculating unit 52 calculates fluctuation in dimensions by classification of a semiconductor device using, for example, Expression (1) to Expression (6) shown in FIG. 4 and the inspection data stored in the inspection-data accumulating unit 82.

In Expression (1) to Expression (6), a subscript h is a variable representing a lot of a wafer used for manufacturing of a semiconductor device in a manufacturing period included in manufacturing information. A subscript i is a variable representing a wafer used for the manufacturing of the semiconductor device in the manufacturing period included in the manufacturing information. A subscript j is a variable representing an area when the semiconductor device manufactured in the manufacturing period included in the manufacturing information or a wafer plane is divided into areas having appropriate size.

In Expression (1), $\delta_{all}^2$ is dispersion of dimensions of all target semiconductor devices manufactured in a manufacturing period included in input manufacturing information.

The number of wafers is the number of wafers used for manufacturing of the semiconductor devices in the manufacturing period included in the manufacturing information.

The number of lots is the number of lots of the wafers used for the manufacturing of the semiconductor devices in the manufacturing period included in the manufacturing information.

$\delta^2_{device,\, i,\, h}$ is dispersion of dimensions of the semiconductor devices included in the wafers in the manufacturing period. That is, $\delta^2_{device,\, i,\, h}$ represents the in-plane fluctuation.

$\delta^2_{wafer,\, h}$ is dispersion of dimensions among the wafers in the manufacturing period. That is, $\delta^2_{wafer,\, h}$ represents the inter-wafer fluctuation.

$\delta^2_{lot}$ is dispersion of dimensions among the lots in the manufacturing period. That is, $\delta^2_{lot}$ represents the inter-lot fluctuation.

In Expression (2), the number of devices is the number of semiconductor devices manufactured in the manufacturing period included in the manufacturing information.

$x_{h,\, j,\, i}$ is data of one dimension included in inspection data.

$\overline{x_{h,\, i}}$ with an over line is an average of a plurality of dimension data in a certain wafer.

In Expression (3), $\overline{x_h}$ with an over line is an average of data of dimensions in one lot.

In Expression (4), $\overline{x}$ with an over line is an average of data of all dimensions included in the inspection data. In Expression (6), "(the number of devices×the number of wafers) @lot" is a product of the number of semiconductor devices and the number of wafers in one lot.

As described above, the fluctuation-by-classification calculating unit 52 calculates, for example, dispersion as fluctuation in dimensions. For example, the fluctuation-by-classification calculating unit 52 reads out the inspection data stored in the inspection-data accumulating unit 82 and substitutes data of dimensions included in the inspection data in Expression (1) to Expression (6) above. Consequently, it is possible to calculate fluctuation (dispersion) in dimensions by classification among lots, among wafers, and in positions in a wafer plane. The fluctuation may be, for example, a standard deviation.

The data-by-factor acquiring unit 53 accesses the knowledge DB 43, for example, on the basis of at least one of the manufacturing information stored in the manufacturing-information accumulating unit 81 and the inspection data stored in the inspection-data accumulating unit 82. The data-by-factor acquiring unit 53 reads out, from the knowledge DB 43, improvement history data corresponding to a target semiconductor device and a target manufacturing process.

The corresponding improvement history data is, for example, improvement history data of a semiconductor device and a manufacturing process same as the target semiconductor device and the target manufacturing process. That is, the corresponding improvement history data is improvement history data including improvement measures implemented in the past for the same semiconductor device and the same manufacturing process.

The same semiconductor device is, for example, a semiconductor device of the same type and a semiconductor device of a type regarded as substantially the same. The same manufacturing process is, for example, the same manufacturing process and a manufacturing process that can be regarded as substantially the same.

Note that the improvement history data to be read out may be one data or may be a plurality of data. The data-by-factor acquiring unit 53 may read out a plurality of improvement history data corresponding to the semiconductor device from the knowledge DB 43.

The data-by-factor acquiring unit 53 determines whether the target semiconductor device is a mass-produced product or a product under development. The data-by-factor acquiring unit 53 performs the determination, for example, on the basis of manufacturing information. When determining that the target semiconductor device is the product under development, the data-by-factor acquiring unit 53 accesses the simulation DB 44 and reads out a result of a simulation corresponding to the target semiconductor device and the target manufacturing process from the simulation DB 44. The data-by-factor acquiring unit 53 reads out, for example, a result of a process simulation concerning a new manufacturing process from the simulation DB 44. Note that, for example, the result of the process simulation may be acquired from a process simulator by starting the process simulator according to a request from the data-by-factor acquiring unit 53.

The data-by-factor accumulating unit 83 temporarily stores the improvement history data and the result of the process simulation read out by the data-by-factor acquiring unit 53. The data-by-factor acquiring unit 53 causes the data-by-factor accumulating unit 83 to store the improvement history data read out from the knowledge DB 43 and the result of the process simulation read out from the simulation DB.

The fluctuation-by-factor calculating unit 54 calculates fluctuation in dimensions by fluctuation factor on the basis of the inspection data stored in the inspection-data accumulating unit 82 and the improvement history data and the result of the process simulation stored in the data-by-factor accumulating unit 83.

First, the fluctuation-by-factor calculating unit 54 determines a plurality of fluctuation factors of the target semiconductor device and the target manufacturing process on the basis of information concerning a plurality of fluctuation factors included in the improvement history data. The fluctuation-by-factor calculating unit 54 determines, for example, the respective plurality of fluctuation factors included in the improvement history data as the plurality of fluctuation factors of the target semiconductor device and the target manufacturing process.

After determining the plurality of fluctuation factors, the fluctuation-by-factor calculating unit 54 calculates fluctuation in dimensions by determined plurality of fluctuation factors, for example, on the basis of the inspection data and the improvement history data.

The fluctuation-by-factor calculating unit 54 determines a plurality of improvement measures of the target semiconductor devices and the target manufacturing process on the basis of information concerning a plurality of improvement measures included in the improvement history data. The fluctuation-by-factor calculating unit 54 determines, for example, the respective plurality of improvement measures included in the improvement history data as the plurality of improvement measures of the target semiconductor device and the target manufacturing process.

The fluctuation-by-factor calculating unit 54 calculates, on the basis of the inspection data and information concerning a plurality of improvement prospects included in the improvement history data, concerning each of the plurality of improvement measures, improvement prospects of dimensions expected when the improvement measures are implemented for the target semiconductor device and the target manufacturing process. The fluctuation-by-factor calculating unit 54 calculates improvement prospects of the target semiconductor device and the target manufacturing process, for example, according to a relative ratio of dimensions included in the inspection data and dimensions of improvement prospects included in the improvement history data. The fluctuation-by-factor calculating unit 54 calculates, concerning each of the plurality of improvement measures of the target semiconductor device and the target manufacturing process, improvement prospects for each of the improvement measures.

When the result of the process simulation is stored in the data-by-factor accumulating unit 83, the fluctuation-by-factor calculating unit 54 performs the determination of fluctuation factors for a new manufacturing process, the calculation of fluctuation by factor, the determination of an improvement measure, and the calculation of improvement prospects on the basis of the result of the process simulation.

After performing the determination of fluctuation factors, the calculation of fluctuation by factor, the determination of an improvement measure, and the calculation of improvement prospects, the fluctuation-by-factor calculating unit 54 outputs these kinds of information to the data-by-factor-calculation-result accumulating unit 84 as a calculation result. The data-by-factor-calculation-result accumulating unit 84 temporarily stores the calculation result input from the fluctuation-by-factor calculating unit 54.

Figure 5A:
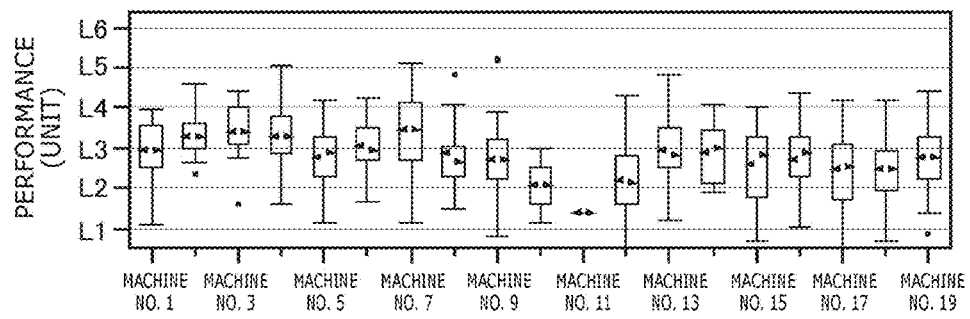
FIGS. 5A to 5C are schematic views showing an example of calculation of the fluctuation-by-factor calculating unit according to the embodiment.
Figure 5B:
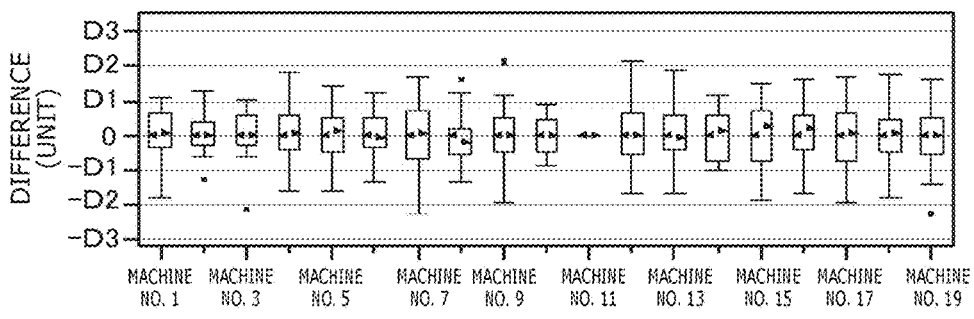
Figure 5C:
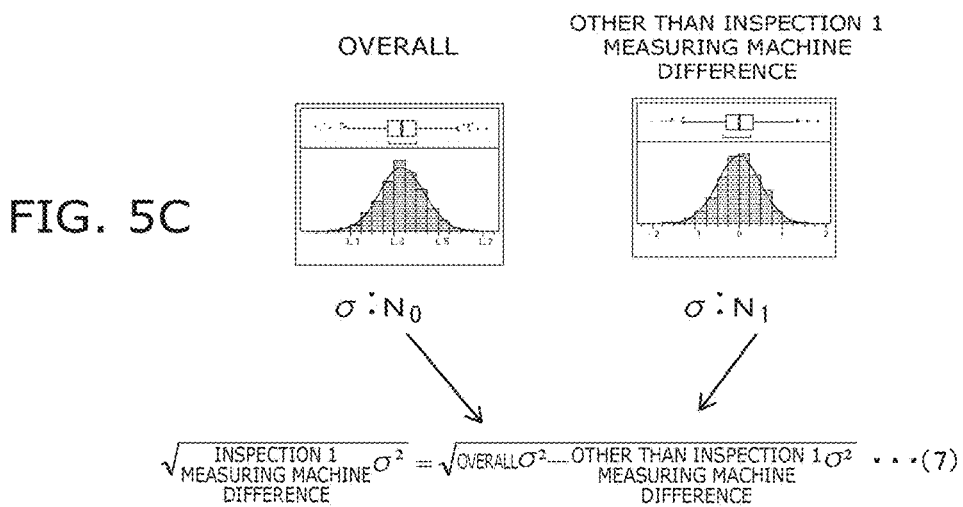

FIGS. 5A to 5C are schematic views showing an example of calculation of the fluctuation-by-factor calculating unit according to the embodiment.

FIGS. 5A to 5C show, as a calculation example of the fluctuation-by-factor calculating unit 54, calculation of fluctuation in measured dimensions among a plurality of inspection apparatuses 14 of the same model used for an inspection process for semiconductor devices. That is, FIGS. 5A to 5C are a calculation example of fluctuation in a measurement error among the inspection apparatuses 14. For example, in a semiconductor device, refining like manufacturing accuracy of 1 nm or 0.1 nm is in progress. Differences among the inspection apparatuses 14 cannot be neglected. In this case, for example, matching of measurement values among the inspection apparatuses 14 is an example of an improvement measure. Note that, in FIGS. 5A to 5C, a calculation example performed using a length measurement SEM measuring machine as the inspection apparatus 14 is illustrated.

FIG. 5A is a box plot diagram in which inspection data of a plurality of semiconductor devices are collected for each of the inspection apparatuses 14. The abscissa of FIG. 5A indicates the measuring machine and the ordinate indicates measured dimensions. When calculating fluctuation in measured dimensions among the inspection apparatuses 14, the fluctuation-by-factor calculating unit 54 collects inspection data for each of the inspection apparatuses 14 as shown in FIG. 5A.

FIG. 5B is a box plot diagram showing values obtained by subtracting an average of each of data of each of the inspection apparatuses 14 from each of the data of each of the inspection apparatuses 14. The abscissa of FIG. 5B indicates the measuring machine and the ordinate is a value obtained by subtracting the average. After collecting inspection data for each of the inspection apparatuses 14, the fluctuation-by-factor calculating unit 54 performs calculation for subtracting an average of data of one inspection apparatus 14 from each of the data of the inspection apparatus 14. The fluctuation-by-factor calculating unit 54 performs this calculation for each of the inspection apparatuses 14. In this way, a value remaining after subtracting the average can be considered fluctuation due to factors other than fluctuation in the measured dimensions among the inspection apparatuses 14.

As shown in FIG. 5C, after performing the calculation for subtracting the average, the fluctuation-by-factor calculating unit 54 calculates a standard deviation of the original data collected for each of the inspection apparatuses 14 (a standard deviation of the data shown in FIG. 5A) and a standard deviation of the data after the subtraction of the average (a standard deviation of the data shown in FIG. 5B). As indicated by Expression (7), the fluctuation-by-factor calculating unit 54 subtracts, from the standard deviation of the original data, the standard deviation of the data after the subtraction of the average. Consequently, the fluctuation-by-factor calculating unit 54 calculates a standard deviation of fluctuation in the measured dimensions among the inspection apparatuses 14.

The fluctuation-by-factor calculating unit 54 calculates fluctuation in dimensions by fluctuation factor on the basis of the inspection data and the improvement history data, for example, according to the procedure described above. However, a process of the calculation is different depending on fluctuation factors.

The defective-rate-data acquiring unit 55 accesses the defect information DB 45, for example, on the basis of the manufacturing information stored in the manufacturing-information accumulating unit 81. The defective-ratio-data acquiring unit 55 reads out defective rate data corresponding to the target semiconductor device and the target manufacturing process from the defect information DB 45.

The defective-rate-data accumulating unit 85 temporarily stores the defective rate data read out by the defective-rate-data acquiring unit 55. The defective-rate-data acquiring unit 55 causes the defective-rate-data accumulating unit 85 to store the defective rate data read out from the defect information DB 45.

The yield calculating unit 56 calculates a predicted yield of each of a plurality of improvement measures, for example, on the basis of the inspection data stored in the inspection-data accumulating unit 82, the calculation result stored in the data-by-factor-calculation-result accumulating unit 84, and the defective rate data stored in the defective-rate-data accumulating unit 85. The yield calculating unit 56 calculates a predicted yield before implementation of the improvement measure, for example, on the basis of the inspection data and the defective rate data. The yield calculating unit 56 calculates a predicted yield after the implementation of the improvement measure, for example, on the basis of the information concerning the improvement prospects of dimensions included in the calculation result and the defective rate data.

Figure 6A:
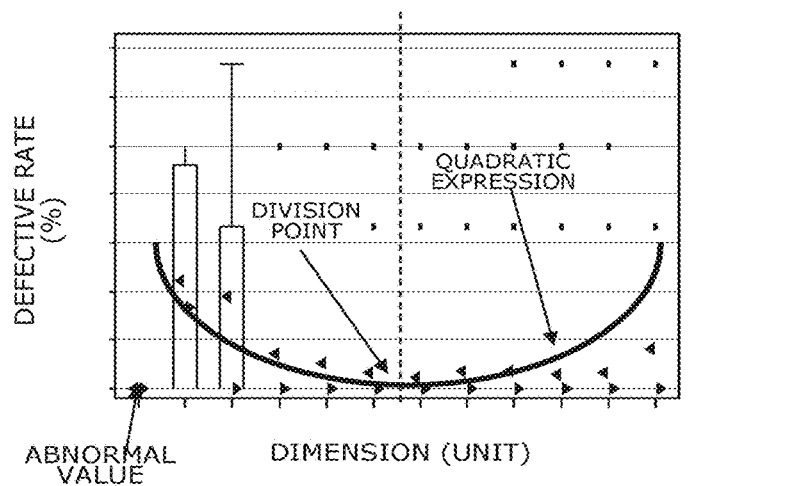
FIGS. 6A to 6C are schematic views showing an example of calculation of the yield calculating unit according to the embodiment.
Figure 6B:
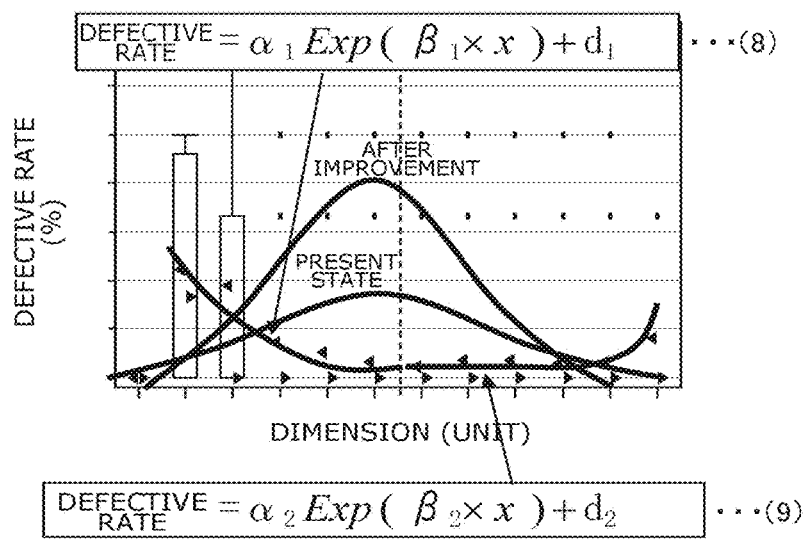
Figure 6C:
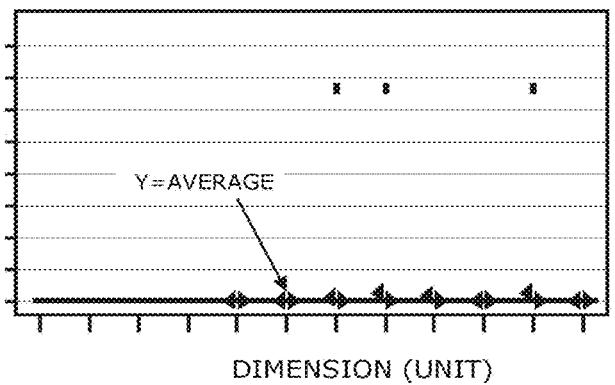

FIGS. 6A to 6C are schematic views showing an example of calculation of the yield calculating unit according to the embodiment.

The yield calculating unit 56 acquires data in lot units and creates a correlation, for example, concerning inspection data and defective rate data. For example, the yield calculating unit 56 calculates an average of yields at a predetermined Binning width. The yield calculating unit 56 creates a correlation between a defective rate and dimensions. The yield calculating unit 56 removes abnormal values or the like at data ends. For example, as shown in FIG. 6A, the yield calculating unit 56 performs fitting according to a quadratic function and sets, as a division point, a value of a dimension (the abscissa) having a minimum value. For example, when there is little correlation between the defective rate and the dimensions or when abnormality or the like of the fitting occurs, the yield calculating unit 56 draws a line of an average of a defective rate (the ordinate) as shown in FIG. 6C.

The yield calculating unit 56 performs fitting for the left and the right of the division point according to a Gaussian function (Exp) and creates Expression (8) and Expression (9). At this point, when there is a place where the yield is 0%, for example, $1 \times 1^{-6}$% is substituted. Consequently, it is possible to appropriately perform the fitting by the Gaussian function. The yield calculating unit 56 calculates, for each of the improvement measures, a predicted yield before improvement and a predicted yield after improvement according to the created Expression (8) and Expression (9).

The man-hour-data acquiring unit 57 reads out information concerning a man-hour related to implementation of the improvement measure from the improvement history data stored in the data-by-factor accumulating unit 83. The man-hour-data acquiring unit 57 acquires, as a predicted man-hour related to the implementation of the improvement measure, for example, information concerning a man-hour included in the improvement history data. The man-hour-data acquiring unit 57 acquires a plurality of predicted man-hours corresponding to the respective plurality of improvement measures.

The production-plan-data acquiring unit 58 accesses the production plan DB 46 on the basis of the manufacturing information stored in the manufacturing-information accumulating unit 81. The production-plan-data acquiring unit 58 reads out production plan data corresponding to the target semiconductor device and the target manufacturing process from the production plan DB 46.

The production-plan-data accumulating unit 86 temporarily stores the production plan data read out by the production-plan-data acquiring unit 58. The production-plan-data acquiring unit 58 causes the production-plan-data accumulating unit 86 to store the production plan data read out from the production plan DB 46.

The expense calculating unit 59 calculates predicted expenses after the implementation of the improvement measure on the basis of the production plan data stored in the production-plan-data accumulating unit 86. The expense calculating unit 59 calculates a plurality of predicted expenses corresponding to the respective plurality of improvement measures.

The measure-priority-level calculating unit 60 performs priority ordering of the plurality of improvement measures, for example, on the basis of at least any one of the predicted yield calculated by the yield calculating unit 56, the predicted man-hour acquired by the man-hour-data acquiring unit 57, and the predicted expenses calculated by the expense calculating unit 59. The measure-priority-level calculating unit 60 performs the priority ordering, for example, on the basis of each of the predicted yield, the predicted man-hour, and the predicted expenses. For example, the measure-priority-level calculating unit 60 sets a high priority level for an improvement measure having a high improvement rate of the predicted yield. For example, the measure-priority-level calculating unit 60 sets a high priority level for an improvement measure having a short predicted man-hour. For example, the measure-priority-level calculating unit 60 sets a high priority level for an improvement measure having low predicted expenses. Consequently, it is possible to perform more appropriate priority ordering.

The output unit 61 creates an electronic file EF including respective kinds of information concerning the calculation result of the fluctuation-by-classification calculating unit 52, the calculation result of the fluctuation-by-factor calculating unit 54, the calculation result of the yield calculating unit 56, the acquired data of the man-hour-data acquiring unit 57, the calculation result of the expense calculating unit 59, and the calculation result of the measure-priority-level calculating unit 60. The output unit 61 transmits the created electronic file EF to the client terminal 30. The output unit 61 creates, for example, a text file described in a markup language of an HTML format or the like as the electronic file EF. A file format of the electronic file EF is not limited to this and may be any file format displayable in the client terminal 30. The output unit 61 may create one electronic file FE in which, for example, the calculation results of the units are collected or may create, for example, a plurality of electronic files EF for each of the calculation results of the units.

The respective kinds of information stored in the manufacturing-information accumulating unit 81, the inspection-data accumulating unit 82, the data-by-factor accumulating unit 83, the data-by-factor-calculation-result accumulating unit 84, the defective-rate-data accumulating unit 85, and the production-plan-data accumulating unit 86 are stored and retained in the units, for example, until one decision making supporting processing is completed. The respective kinds of information may be stored and retained in the units, for example, until the next decision making supporting processing is started.

Figure 7:
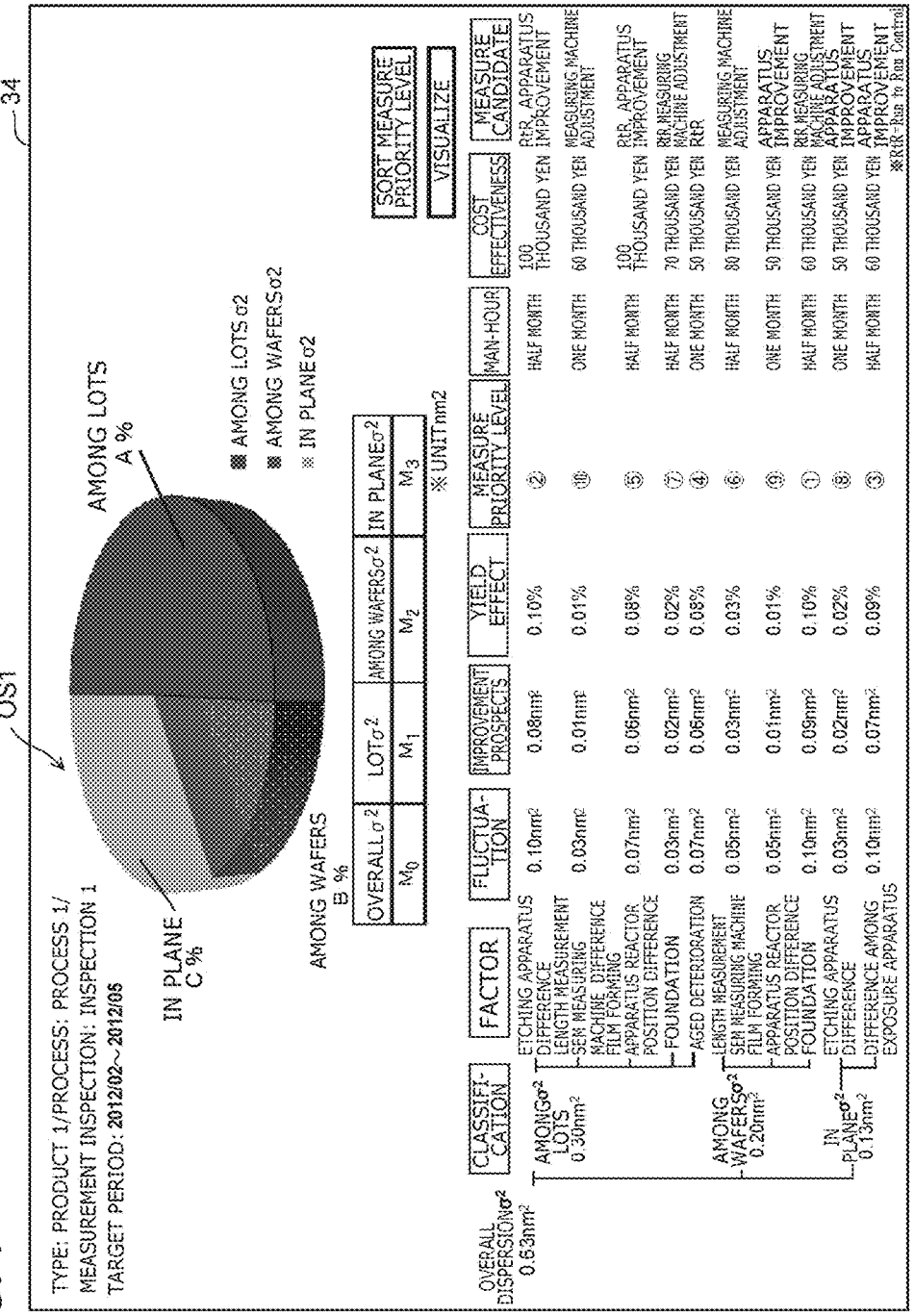
FIG. 7 is a schematic view showing an example of an output screen according to the embodiment.

FIG. 7 is a schematic view showing an example of an output screen according to the embodiment.

When receiving the electronic file EF sent from the manufacturing supporting apparatus 20, the control unit 31 of the client terminal 30 causes, on the basis of the electronic file EF, the display unit 34 to display, for example, a first output screen OS1 shown in FIG. 7. That is, in the example, the control unit 31 functions as a display control unit.

On the first output screen OS1, for example, the fluctuation in dimensions of the entire target semiconductor device and the fluctuation in dimensions by classification calculated by the fluctuation-by-classification calculating unit 52 are displayed. On the first output screen OS1, for example, the fluctuation factors of the target semiconductor device determined by the fluctuation-by-factor calculating unit 54 are displayed. On the first output screen OS1, for example, the fluctuation in dimensions by fluctuation factor calculated by the fluctuation-by-factor calculating unit 54 is displayed. On the first output screen OS1, for example, the improvement measure of the target semiconductor device determined by the fluctuation-by-factor calculating unit 54 is displayed. On the first output screen OS1, for example, the information concerning the improvement prospects of dimensions calculated by the fluctuation-by-factor calculating unit 54 is displayed. On the first output screen OS1, for example, the predicted yield calculated by the yield calculating unit 56 is displayed. The predicted yield is displayed, for example, in a form of an improvement rate from a yield before the implementation of the improvement measure. On the first output screen OS1, for example, the priority level of the improvement measure calculated by the measure-priority-level calculating unit 60 is displayed. On the first output screen OS1, for example, the predicted man-hour acquired by the man-hour-data acquiring unit 57 is displayed. On the first output screen OS1, for example, the predicted expenses calculated by the expense calculating unit 59 are displayed.

As described above, the control unit 31 of the client terminal 30 visualizes the calculation results by the manufacturing supporting apparatus 20 on the basis of the electronic file EF and displays the calculation results on the display unit 34. On the first output screen OSI, for example, a graph representing ratios of classifications of fluctuation in dimensions by classification is displayed. In this way, the control unit 31 displays the calculation results by the manufacturing supporting apparatus 20 in a form of a graph. Consequently, for example, it is possible to more clearly show statistical calculation results.

Figure 8:
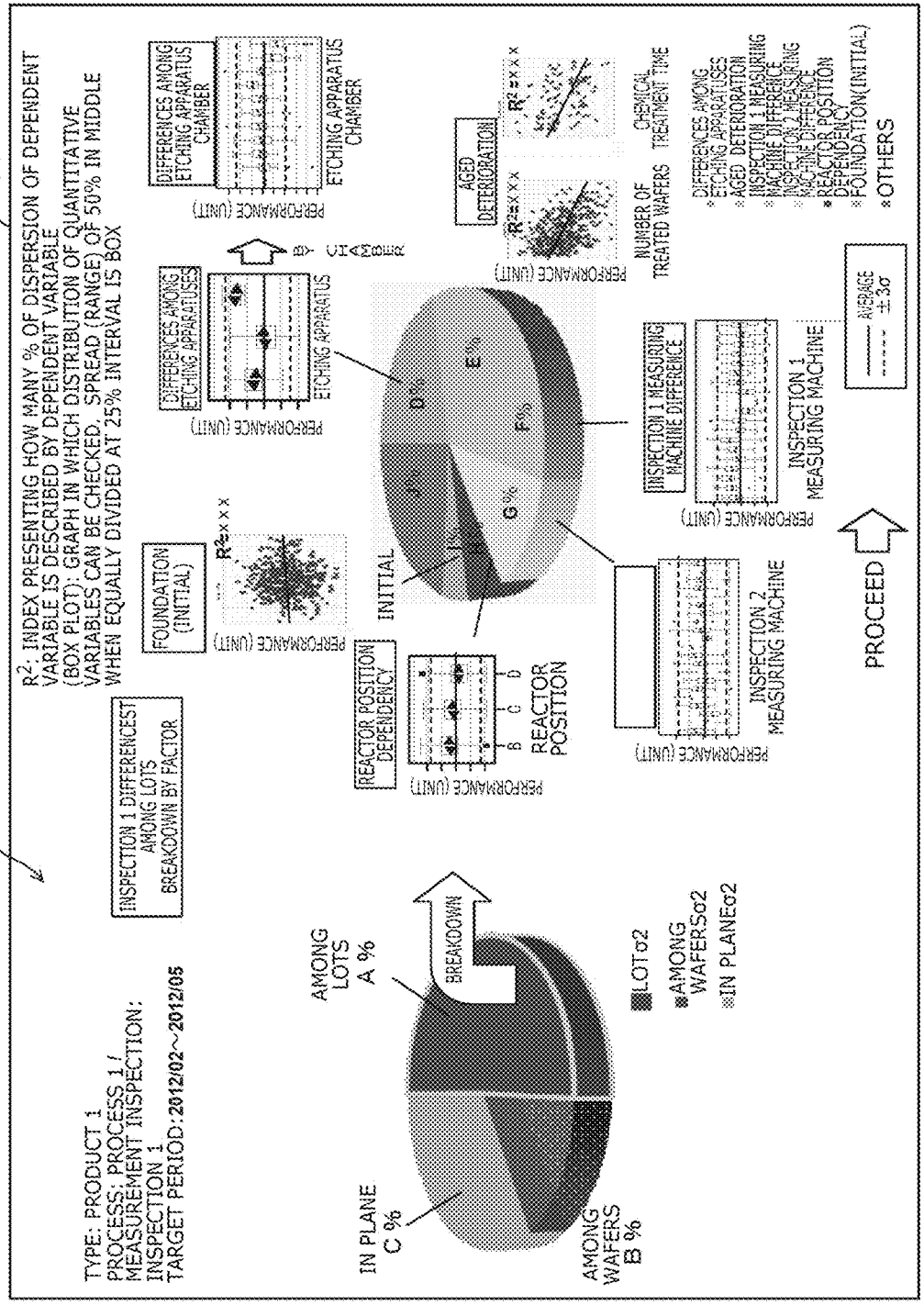
FIG. 8 is a schematic view showing an example of an output screen according to the embodiment.

FIG. 8 is a schematic view showing an example of an output screen according to the embodiment.

FIG. 8 is an example of a second output screen OS2 showing fluctuation in dimensions by factor included in the inter-lot fluctuation.

For example, when display of details of the inter-lot fluctuation is instructed by operation of the input unit 33, the control unit 31 of the client terminal 30 causes the display unit 34 to display the second output screen OS2 shown in FIG. 8. On the second output screen OS2, for example, a graph representing ratios of factors of fluctuation in dimensions by factor calculated by the fluctuation-by-factor calculating unit 54 is displayed.

Figure 9:
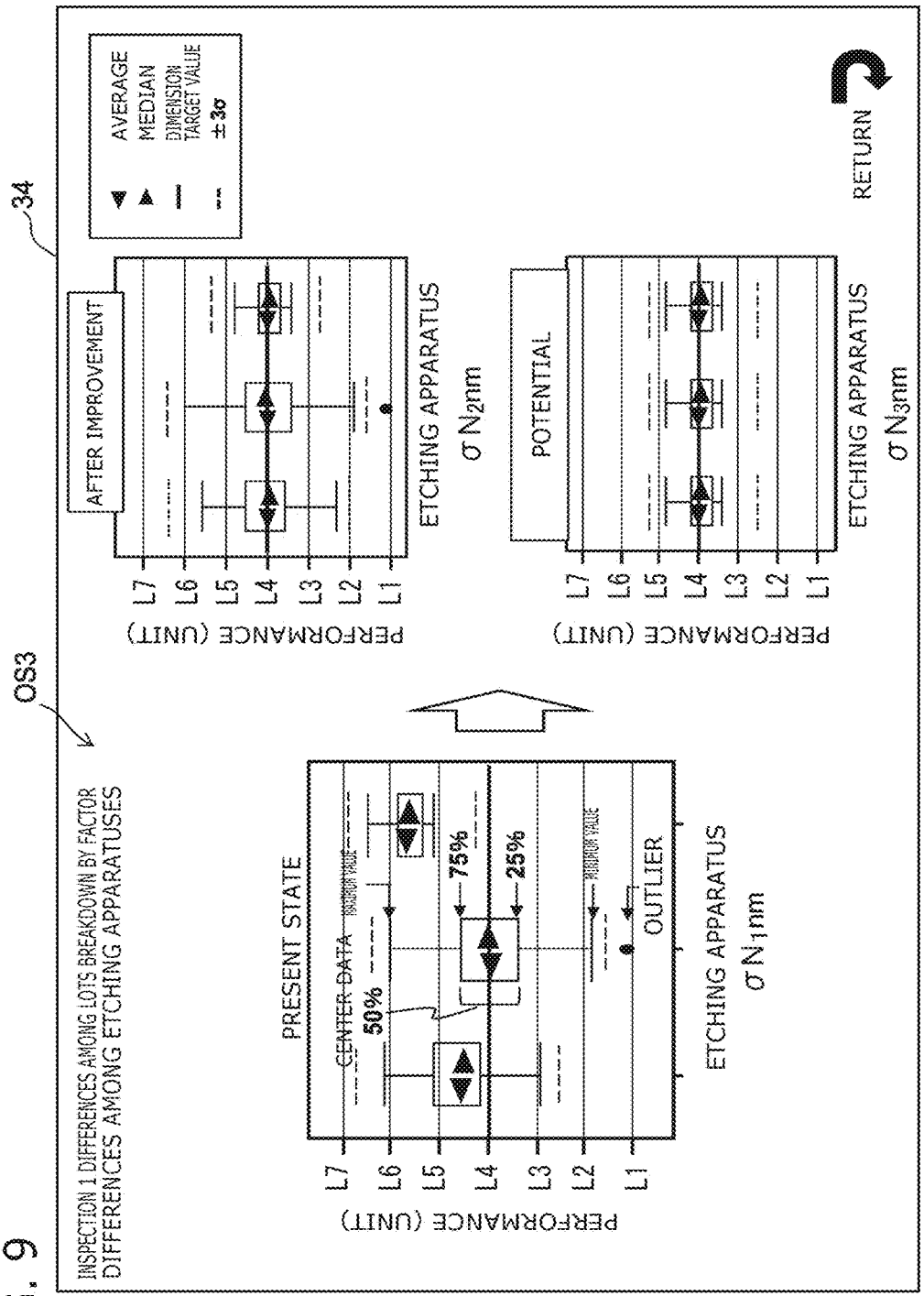
FIG. 9 is a schematic view showing an example of an output screen according to the embodiment.

FIG. 9 is a schematic view showing an example of an output screen according to the embodiment.

FIG. 9 shows an example of detailed display of fluctuation in dimensions by factor included in the inter-lot fluctuation. In FIG. 9, for example, detailed display of differences among wet etching apparatus is instructed.

For example, when detailed display of differences among wet etching apparatuses is instructed by operation of the input unit 33, the control unit 31 of the client terminal 30 causes the display unit 34 to display a third output screen OS3 shown in FIG. 9. On the third output screen OS3, for example, a box plot diagram showing dimensions of inspection data related to the differences among the wet etching apparatuses and a box plot diagram showing dimensions of improvement prospects calculated by the fluctuation-by-factor calculating unit 54 are displayed. As shown in FIG. 9 as "potential", a box plot diagram showing dimensions of improvement prospects adjusted to an apparatus having the highest performance may be able to be further displayed.

Figure 10:
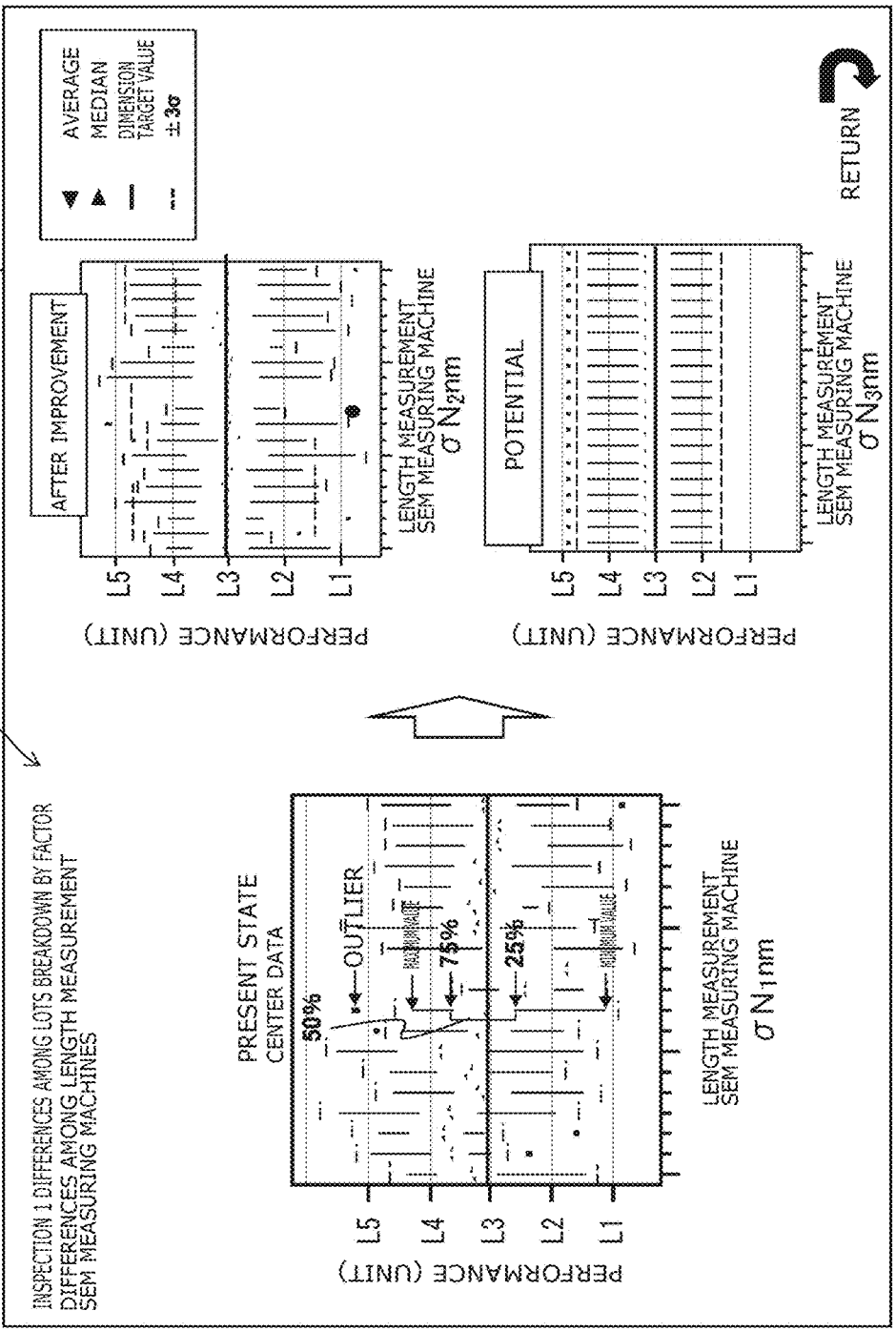
FIG. 10 is a schematic view showing an example of an output screen according to the embodiment.

FIG. 10 is a schematic view showing an example of an output screen according to the embodiment.

FIG. 10 shows an example of detailed display of fluctuation in dimensions by factor included in the inter-lot fluctuation. In FIG. 10, for example, detailed display of differences among three-dimensional measurement SEM measuring machines is instructed.

For example, when detailed display of differences among three-dimensional measurement SEM measuring machines is instructed by operation of the input unit 33, the control unit 31 of the client terminal 30 causes the display unit 34 to display a fourth output screen OS4 shown in FIG. 10. On the fourth output screen OS4, for example, a box plot diagram showing dimensions of inspection data related to the differences among the three-dimensional measurement SEM measuring machines, a box plot diagram showing dimensions of improvement prospects calculated by the fluctuation-by-factor calculating unit 54, and a box plot diagram showing dimensions of improvement prospects adjusted to a measuring machine having the highest performance are displayed.

FIG. 11 is a schematic view showing an example of an output screen according to the embodiment.

FIG. 11 shows an example of detailed display of fluctuation in dimensions by factor included in the inter-lot fluctuation. In FIG. 11, for example, detailed display of fluctuation due to positions in a reactor of an LP-CVD apparatus is instructed.

For example, when detailed display of positions in a reactor of an LP-CVD apparatus is instructed by operation of the input unit 33, the control unit 31 of the client terminal 30 causes the display unit 34 to display a fifth output screen OS5 shown in FIG. 11. On the fifth output screen OS5, for example, a box plot diagram in which inspection data is collected for each of positions in the reactor and a box plot diagram in which dimensions of improvement prospects calculated by the fluctuation-by-factor calculating unit 54 are collected for each of the positions in the reactor are displayed.

Figure 12:
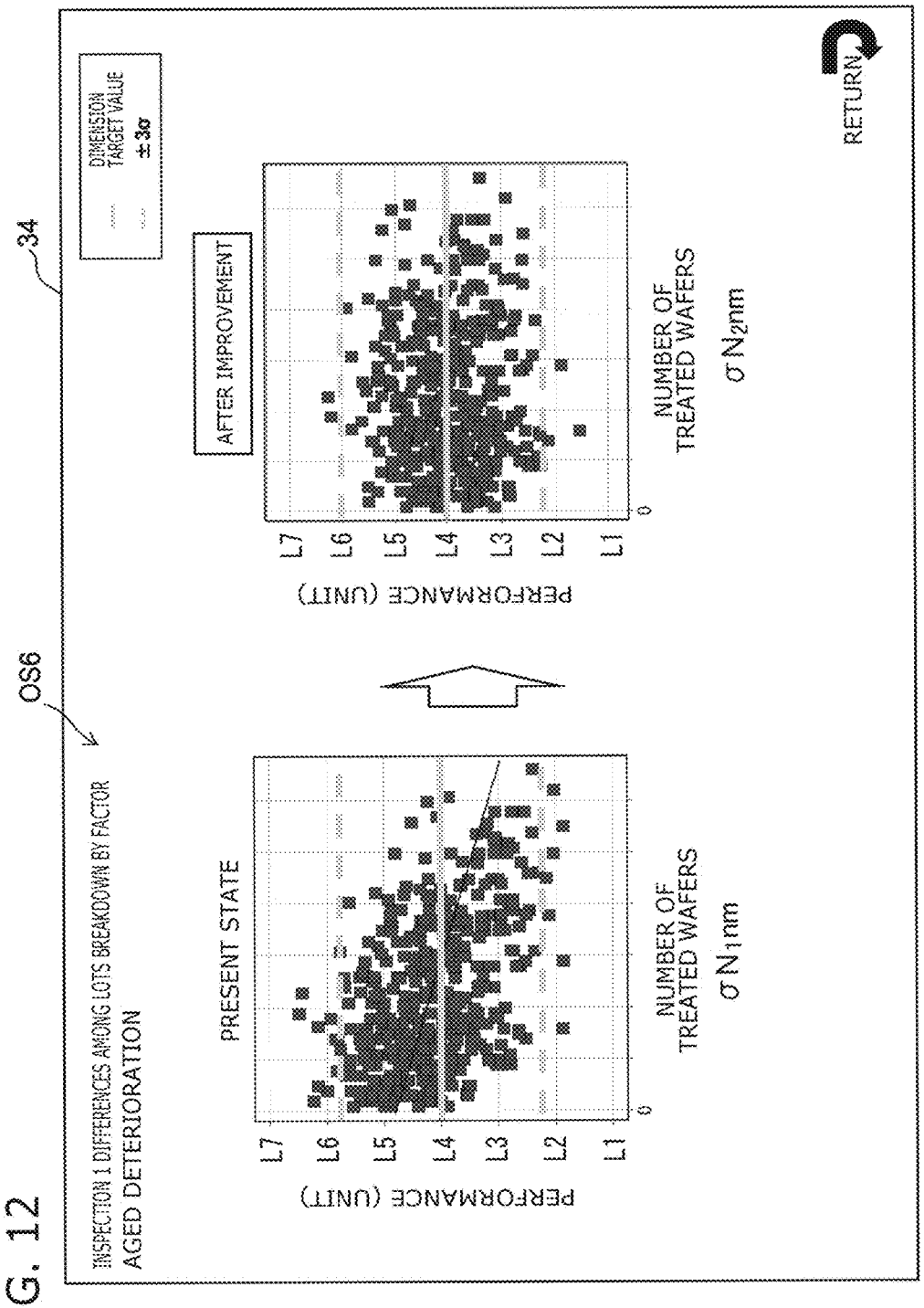
FIG. 12 is a schematic view showing an example of an output screen according to the embodiment.

FIG. 12 is a schematic view showing an example of an output screen according to the embodiment.

FIG. 12 shows an example of detailed display of fluctuation in dimensions by factor included in the inter-lot fluctuation. In FIG. 12, for example, detailed display of aged deterioration among lots is instructed.

For example, when detailed display of aged deterioration is instructed by operation of the input unit 33, the control unit 31 of the client terminal 30 causes the display unit 34 to display a sixth output screen OS6 shown in FIG. 12. On the sixth output screen OS6, for example, a box plot diagram showing dimensions of inspection data related to aged deterioration and a box plot diagram showing dimensions of improvement prospects calculated by the fluctuation-by-factor calculating unit 54 are displayed.

As described above, when the detailed display of the classifications on the first output screen OS1 is instructed, the control unit 31 of the client terminal 30 causes the display unit 34 to display a breakdown of the classifications. In a state in which the control unit 31 causes the display unit 34 to display the breakdown of the classifications, when detailed display of fluctuation by factor is instructed, the control unit 31 causes the display unit 34 to display details of the fluctuation by factor. Consequently, for example, it is possible to clearly inform the user of a statistical calculation result.

Figure 13:
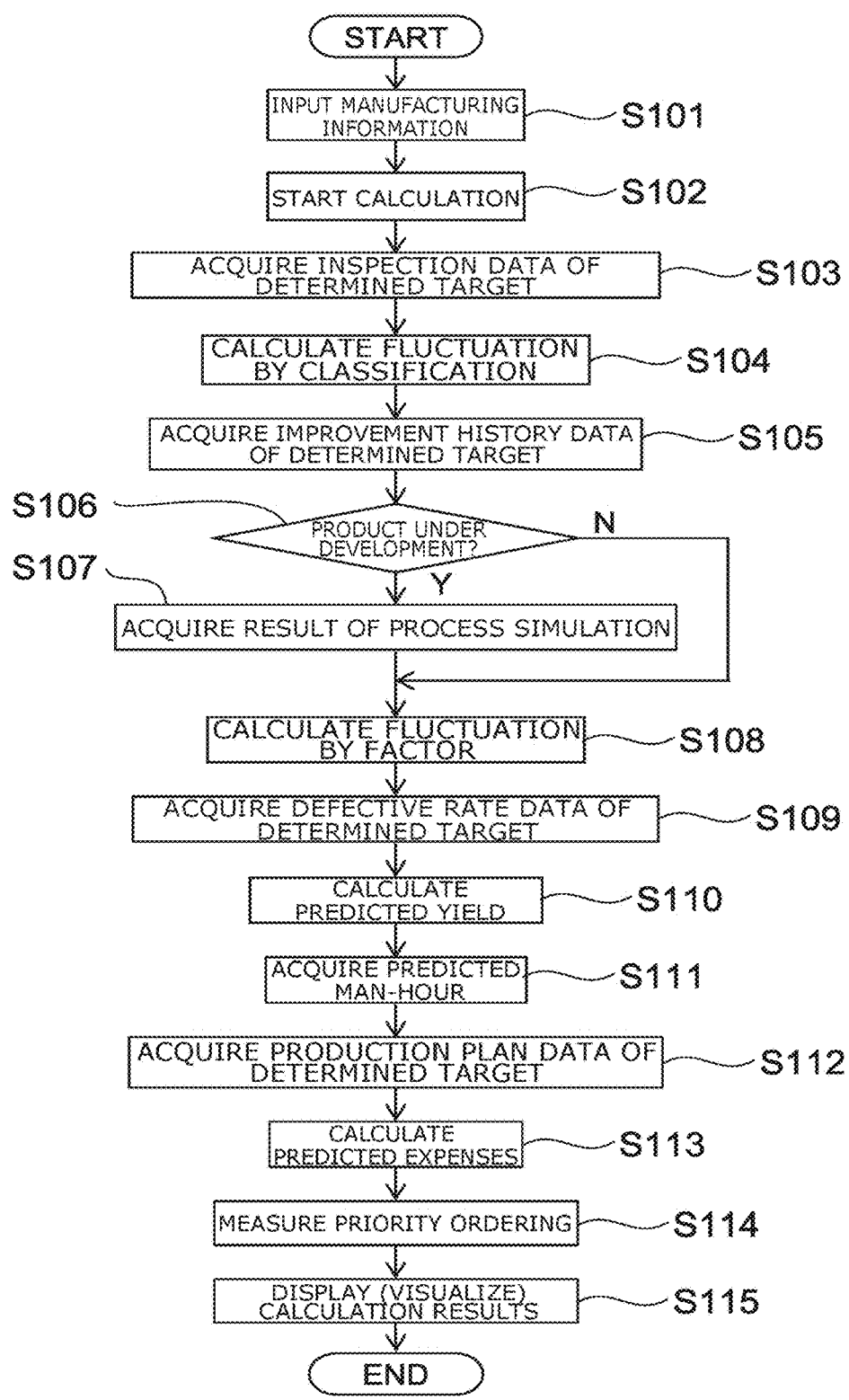
FIG. 13 is a flowchart schematically showing the operation of the manufacturing supporting system according to the embodiment.

FIG. 13 is a flowchart schematically showing the operation of the manufacturing supporting system according to the embodiment.

Action of the manufacturing supporting system 10 is described with reference to the flowchart of FIG. 13.

When the user desires to execute decision making supporting processing for a desired semiconductor device, the user operates the input unit 33 of the client terminal 30 to cause the display unit 34 to display the input screen ES and inputs manufacturing information to the character input boxes TB1 to TB4 of the input screen ES (step S101). The user clicks the determination button SB and instructs a start of various calculations (step S102). The control unit 31 of the client terminal transmits the input manufacturing information to the manufacturing supporting apparatus 20 in response to the click of the determination button SB.

When receiving the manufacturing information transmitted from the client terminal 30, the control unit 21 of the manufacturing supporting apparatus 20 inputs the manufacturing information to the inspection-data acquiring unit 51 and causes the manufacturing-information accumulating unit 81 of the storing unit 22 to store the manufacturing information.

The inspection-data acquiring unit 51 accesses the inspection DB 42 in response to the input of the manufacturing information and reads out inspection data corresponding to the manufacturing information from the inspection DB 42. That is, the inspection-data acquiring unit 51 reads out inspection data of the target semiconductor device from the inspection DB 42 (step S103). The inspection-data acquiring unit 51 causes the inspection-data accumulating unit 82 to store the read-out inspection data.

The control unit 21 instructs, in response to completion of the readout of the inspection data, the fluctuation-by-classification calculating unit 52 to start calculation. The fluctuation-by-classification calculating unit 52 calculates, on the basis of the inspection data stored in the inspection-data accumulating unit 82, fluctuation in dimensions by classification of the target semiconductor device (step S104).

After the calculation of the fluctuation by classification, the control unit 21 instructs the data-by-factor acquiring unit 53 5 to acquire improvement history data. The data-by-factor acquiring unit 53 accesses the knowledge DB 43 on the basis of manufacturing information and the like and reads out improvement history data of the target semiconductor device from the knowledge DB 43 (step S105). The data-by-factor acquiring unit 53 causes the data-by-factor accumulating unit 83 to store the read-out improvement history data.

The data-by-factor acquiring unit 53 determines, on the basis of the manufacturing information, whether the target semiconductor device is a product under development (step S106). When determining that the target semiconductor device is the product under development, the data-by-factor acquiring unit 53 accesses the simulation DB 44 and reads out a result of a process simulation of the target semiconductor device from the simulation DB 44 (step S107). The data-by-factor acquiring unit 53 causes the data-by-factor accumulating unit 83 to store the read-out result of the process simulation. When determining that the target semiconductor device is not the product under development, the data-by-factor acquiring unit 53 does not perform the readout of the result of the process simulation.

After the acquisition of the improvement history data and the result of the process simulation by the data-by-factor acquiring unit 53 is completed, the control unit 21 instructs the fluctuation-by-factor calculating unit 54 to calculate fluctuation in dimensions by fluctuation factor.

The fluctuation-by-factor calculating unit 54 performs, in response to the instruction from the control unit 21, determination of fluctuation factors, calculation of fluctuation by factor, determination of an improvement measure, and calculation of improvement prospects (step S108). The fluctuation-by-factor calculating unit 54 causes the data-by-factor-calculation-result accumulating unit 84 to store these kinds of information as a calculation result. The fluctuation-by-factor calculating unit 54 calculates fluctuation by factor on the basis of the improvement history data stored in the data-by-factor accumulating unit 83. When the result of the process simulation is stored in the data-by-factor accumulating unit 83, that is, when the target semiconductor device is the product under development, the fluctuation-by-factor calculating unit 54 performs calculation for a new manufacturing process on the basis of the result of the process simulation and causes the data-by-factor-calculation-result accumulating unit 84 to store a result of the calculation.

After the calculation of the fluctuation-by-factor calculating unit 54 is completed, the control unit 21 instructs the defective-rate-data acquiring unit 55 to acquire defective rate data.

The defective-rate-data acquiring unit 55 accesses, in response to the instruction from the control unit 21, the defect information DB 45 on the basis of the manufacturing information stored in the manufacturing-information accumulating unit 81. The defective-rate-data acquiring unit 55 reads out defective rate data corresponding to the target semiconductor device and the target manufacturing process from the defect information DB 45. The defective-rate-data acquiring unit 55 causes the defective-rate-data accumulating unit 85 to store the defective rate data read out from the defect information DB 45.

After the acquisition of the defective rate data by the defective-rate-data acquiring unit 55 is completed, the control unit 21 instructs the yield calculating unit 56 to calculate a predicted yield.

The yield calculating unit 56 calculates, in response to the instruction from the control unit 21, a predicted yield before implementation of an improvement measure and a predicted yield after the implementation of the improvement measure (step S110). The yield calculating unit 56 calculates a predicted yield, for example, on the basis of the inspection data stored in the inspection-data accumulating unit 82, the calculation result stored in the data-by-factor-calculation-result accumulating unit 84, the defective rate data stored in the defective-rate-data accumulating unit 85, and the like.

After the calculation of the predicted yield by the yield calculating unit 56 is completed, the control unit 21 instructs the man-hour-data acquiring unit 57 to acquire a predicted man-hour.

The man-hour-data acquiring unit 57 accesses the data-by-factor accumulating unit 83 in response to the instruction from the control unit 21. The man-hour-data acquiring unit 57 acquires, as a predicted man-hour related to the implementation of the improvement measure, information concerning a man-hour included in the improvement history data stored in the data-by-factor accumulating unit 83 (step S111).

After the acquisition of the predicted man-hour by the man-hour-data acquiring unit 57 is completed, the control unit 21 instructs the production-plan-data acquiring unit 58 to acquire production plan data.

The production-plan-data acquiring unit 58 accesses, in response to the instruction from the control unit 21, the production plan DB 46 on the basis of the manufacturing information stored in the manufacturing-information accumulating unit 81. The production-plan-data acquiring unit 58 reads out, from the production plan DB 46, production plan data corresponding to the target semiconductor device and the target manufacturing process and causes the production-plan-data accumulating unit 86 to store the production plan data (step S112).

After the acquisition of the production plan data by the production-plan-data acquiring unit 58 is completed, the control unit 21 instructs the expense calculating unit 59 to calculate predicted expenses.

The expense calculating unit 59 calculates, in response to the instruction from the control unit 21, predicted expenses after the implementation of the improvement measure on the basis of the production plan data stored in the production-plan-data accumulating unit 86 (step S113).

After the calculation of the predicted expenses by the expense calculating unit 59 is completed, the control unit 21 instructs the measure-priority-level calculating unit 60 to execute priority ordering of the improvement measure.

The measure-priority-level calculating unit 60 performs, in response to the instruction from the control unit 21, the priority ordering of the improvement measure included in the calculation result stored in the data-by-factor-calculation-result accumulating unit 84 (step S114). The measure-priority-level calculating unit performs priority ordering of a plurality of improvement measures, for example, on the basis of each of the predicted yield, the predicted man-hour, and the predicted expenses.

After the priority ordering by the measure-priority-level calculating unit 60 is completed, the control unit 21 instructs the output unit 61 to create the electronic file EF.

The output unit 61 creates, in response to the instruction from the control unit 21, the electronic file EF including information concerning the calculation results and transmits the electronic file EF to the client terminal 30.

When receiving the electronic file EF, the control unit 31 of the client terminal 30 causes the display unit 34 to display a screen based on the electronic file EF and visualizes the calculation results. For example, the control unit 31 causes the display unit 34 to display the first output screen OS1 shown in FIG. 7. For example, the control unit 31 visualizes the calculation results with a box plot diagram, a pie graph, or the like and displays the calculation results.

When detailed display of the classifications is instructed, the control unit 31 causes the display unit 34 to display a breakdown of the classifications. For example, the control unit 31 causes the display unit 34 to display the second output screen OS2 shown in FIG. 8. When detailed display of fluctuation by factor is instructed, the control unit 31 causes the display unit 34 to display details of fluctuation by factor. For example, the control unit 31 causes the display unit 34 to display the third output screen OS3 to the sixth output screen OS6 shown in FIGS. 9 to 12.

As described above, in the manufacturing supporting system 10, simply by inputting manufacturing information of a desired semiconductor device, calculation results of fluctuation in dimensions of the entire semiconductor device, fluctuation in dimensions by classification, factors of fluctuation, fluctuation in dimensions by factor, improvement measures for fluctuation, improvement prospects of dimensions, a predicted yield, a predicted man-hour, predicted expenses, priority levels of improvement measures, and the like are displayed on the display unit 34.

Consequently, in the manufacturing supporting system 10, for example, even a person not having expertise can easily and appropriately determine an improvement measure for manufacturing conditions by referring to the calculation results displayed on the display unit 34. For example, compared with when a technician having expertise manually performs a trial calculation, it is possible to reduce time for determination of an improvement measure. For example, it is possible to reduce a cycle of PDCA (Plan-Do-Check-Act) of manufacturing of a semiconductor device. Further, it is possible to suppress occurrence of calculation mistakes and the like.

In the manufacturing supporting system 10, the control unit 21 of the manufacturing supporting apparatus 20 combines a result of a process simulation with improvement history data representing improvement measures implemented in the past to calculate fluctuation in dimensions by factor. Consequently, it is possible to perform not only decision making supporting processing for a semiconductor device of a mass-produced product having data of knowledge in the past but also decision making supporting processing for a semiconductor device of a product under development (a semiconductor device of the next generation).

In the manufacturing supporting system 10, the control unit 31 of the client terminal 30 causes the display unit 34 to display the calculation results and visualizes the calculation results. Consequently, it is possible to clearly show statistical calculation results to the user. The control unit 31 displays the calculation results in a form of a graph. Consequently, it is possible to more clearly show the calculation results to the user.

Figure 14:
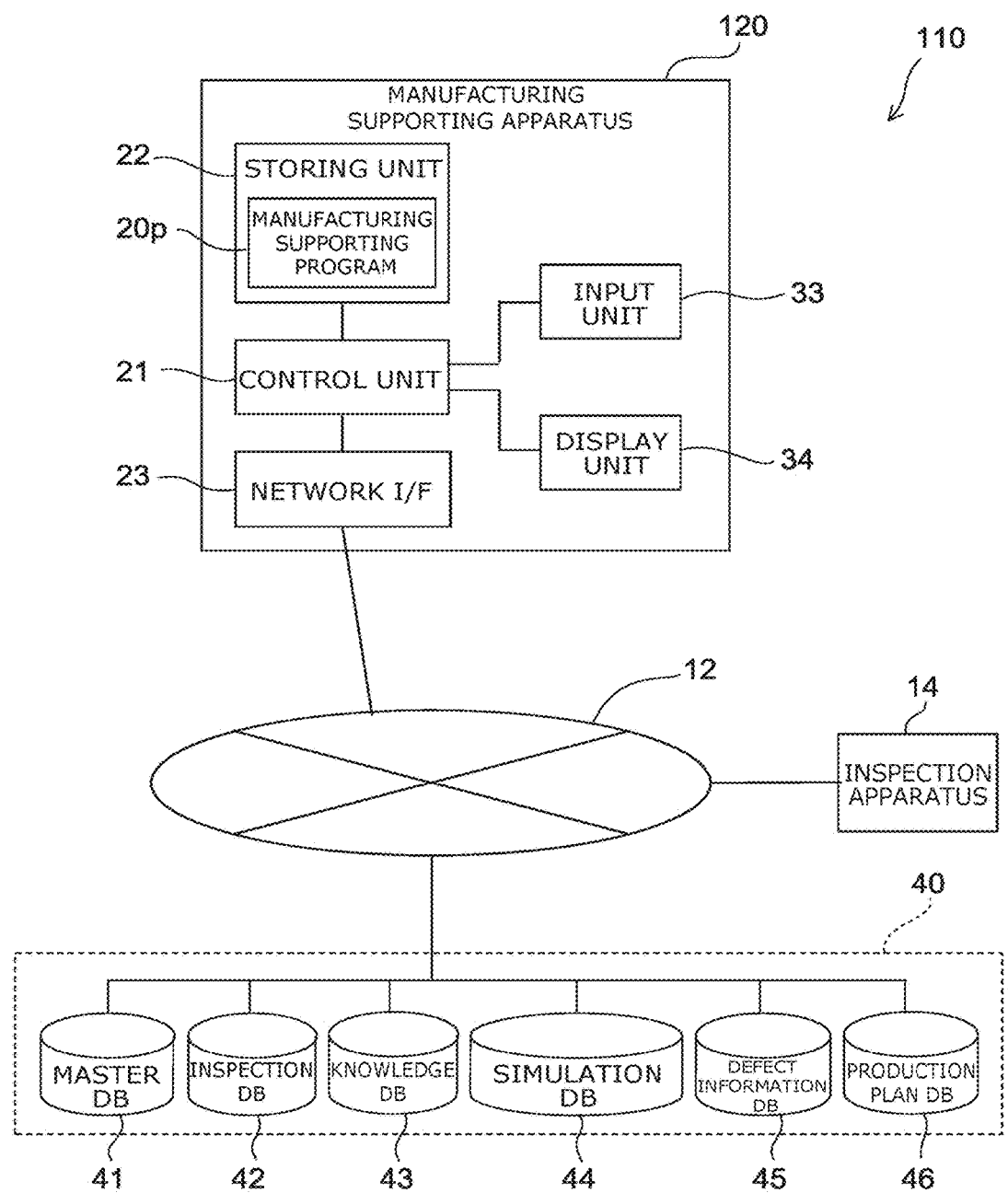
FIG. 14 is a schematic block diagram showing another manufacturing supporting system according to the embodiment.

FIG. 14 is a schematic block diagram showing another manufacturing supporting system according to the embodiment.

As shown in FIG. 14, in a manufacturing supporting system 110 in the example, a manufacturing supporting apparatus 120 includes the input unit 33 and the display unit 34. In the manufacturing supporting system 110, input of manufacturing information is performed in the manufacturing supporting apparatus 120. Like the manufacturing supporting apparatus 20, the manufacturing supporting apparatus 120 performs various kinds of calculation on the basis of the input manufacturing information. The manufacturing supporting apparatus 120 displays calculation results on the display unit 34. In the example, the control unit 21 functions as a display control unit.

As described above, the input unit 33 and the display unit 34 may be provided in the manufacturing supporting apparatus 120. In the manufacturing supporting system 110, the DBs 41 to 46 are provided on the outside of the manufacturing supporting apparatus 120. Note only this, but, for example, the DBs 41 to 46 may be provided in the manufacturing supporting apparatus 120. In other words, a manufacturing supporting system may be provided as one manufacturing supporting apparatus. For example, the manufacturing supporting apparatus 120 may be incorporated in a semiconductor manufacturing apparatus such as an etching apparatus or a film forming apparatus. For example, the manufacturing supporting apparatus 120 may be used when it is desired to determine an improvement measure for one manufacturing process of the semiconductor manufacturing apparatus.

According to the embodiment, a manufacturing supporting system, a manufacturing supporting method, and a manufacturing supporting program for an electronic device that support determination of an improvement measure for manufacturing conditions is provided.

The embodiments of the invention have been described above with reference to examples. However, the invention is not limited to these examples. For instance, any specific configurations of various components such as the inspection-data acquiring unit, fluctuation-by-classification calculating unit, data-by-factor acquiring unit, fluctuation-by-factor calculating unit, defective-rate-data acquiring unit, yield calculating unit, display control unit, measure-priority-level calculating unit, man-hour-data acquiring unit, production-plan-data acquiring unit, and expense calculating unit included in the manufacturing supporting system can be variously modified in shape, size, material, layout and the like by those skilled in the art. Such modifications are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

Moreover, all manufacturing supporting systems, manufacturing supporting methods, and manufacturing supporting programs for electronic device practicable by an appropriate design modification by one skilled in the art based on the all manufacturing supporting systems, manufacturing supporting methods, and manufacturing supporting programs for electronic device described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A manufacturing supporting system for an electronic device comprising:
    an inspection-data acquiring unit configured to acquire, on the basis of specific information for specifying a target electronic device, from an inspection database that stores a plurality of inspection data including information concerning dimensions acquired in an inspection process and the specific information, the inspection data of the target electronic device;
    a fluctuation-by-classification calculating unit configured to calculate, on the basis of the inspection data of the target electronic device, by classification including at least any one of positions among lots, among substrates, and in a substrate plane of the electronic device, fluctuation in dimensions of the target electronic device;
    a data-by-factor acquiring unit configured to acquire, from a knowledge database that stores a plurality of improvement history data including information concerning a type of the electronic device, information concerning a manufacturing process in the type, information concerning fluctuation factors of a dimension of a measurement and other properties planned in past by the classification for the manufacturing process, and information concerning a plurality of improvement measures for each of the fluctuation factors, the improvement history data of the target electronic device on the basis of the specific information; and
    a fluctuation-by-factor calculating unit configured to determine a fluctuation factor of the measurement and the other properties of the target electronic device on the basis of information concerning the fluctuation factors of the dimension of the measurement and the other properties included in the improvement history data of the target electronic device, calculate fluctuation in dimensions by the determined fluctuation factor of the measurement and the other properties, and determine a plurality of improvement measures for the target electronic device on the basis of the information concerning the plurality of improvement measures included in the improvement history data.

2. The system according to claim 1, further comprising a display control unit configured to display, on a display unit, a calculation result of the fluctuation in the dimensions by classification and a calculation result of the fluctuation in the dimensions by the fluctuation factor of the measurement and the other properties.

3. The system according to claim 2, wherein the display control unit displays the calculation results in a form of a graph.

4. The system according to claim 2, further comprising:
    a defective-rate-data acquiring unit configured to acquire, from a defect information database that stores a plurality of defective rate data including the information concerning a type of the electronic device, the information concerning a manufacturing process in the type, and a correlation between dimensions and a yield in the manufacturing process, the defective rate data of the target electronic device on the basis of the specific information; and
    a yield calculating unit configured to calculate a predicted yield for each of the plurality of improvement measures on the basis of the inspection data and the defective rate data of the target electronic device, wherein
    the display control unit further displays the predicted yield on the display unit.

5. The system according to claim 4, further comprising a measure-priority-level calculating unit configured to perform priority ordering of the plurality of improvement measures on the basis of the predicted yield calculated by the yield calculating unit, wherein
    the display control unit further displays the priority level on the display unit.

6. The system according to claim 2, further comprising a man-hour-data acquiring unit configured to acquire a predicted man-hour for implementation of the improvement measures, wherein
    the improvement history data further includes information concerning a man-hour consumed until the improvement measures are implemented,
    the man-hour-data acquiring unit acquires, as the predicted man-hour related to the implementation of the improvement measures, information concerning the man-hour included in the improvement history data of the target electronic device, and the display control unit further displays the predicted man-hour on the display unit.

7. The system according to claim 2, further comprising:
a production-plan-data acquiring unit configured to acquire, from a production plan database that stores a plurality of production plan data including the information concerning a type of the electronic device, the information concerning a manufacturing process in the type, and information concerning expenses for implementation of improvement measures for fluctuation factors of the manufacturing process, the production plan data of the target electronic device on the basis of the specific information; and an expense calculating unit configured to calculate predicted expenses after implementation of the improvement measures on the basis of the production plan data of the target electronic device, wherein the display control unit further displays the predicted expenses on the display unit.

8. The system according to claim 1, wherein the fluctuation-by-factor calculating unit performs, on the basis of a result of a process simulation, determination of fluctuation factors for a new manufacturing process, calculation of fluctuation by factor, and determination of improvement measures.

9. The system according to claim 2, wherein the display control unit further displays the plurality of improvement measures determined by the fluctuation-by-factor calculating unit.

10. The system according to claim 2, further comprising:
an input unit for performing input operation for the specific information; and a control unit configured to input the specific information, which is input from the input unit, to the inspection-data acquiring unit.

11. The system according to claim 10, wherein
the display control unit causes the display unit to display an input screen for inputting the specific information, and the specific information is input via the input screen and the input operation of the input unit.

12. The system according to claim 10, further comprising:
a manufacturing supporting apparatus; and a client terminal connected to the manufacturing supporting apparatus via a network, wherein the manufacturing supporting apparatus includes the inspection-data acquiring unit, the fluctuation-by-classification calculating unit, the data-by-factor acquiring unit, the fluctuation-by-factor calculating unit, and the control unit, and the client terminal includes the input unit and the display control unit.

13. The system according to claim 12, wherein the manufacturing supporting apparatus is connected to each of the inspection database and the knowledge database via the network.

14. The system according to claim 10, further comprising a manufacturing supporting apparatus including the inspection-data acquiring unit, the fluctuation-by-classification calculating unit, the data-by-factor acquiring unit, the fluctuation-by-factor calculating unit, the display control unit, the input unit, and the control unit.

15. The system according to claim 1, wherein the fluctuation-by-factor calculating unit calculates, for each of the plurality of improvement measures, improved prospects of dimensions after implementation of the improvement measures for the target electronic device on the basis of the inspection data and information concerning a plurality of improvement prospects included in the improvement history data.

16. The system according to claim 1, wherein the specific information includes manufacturing information related to manufacturing of the electronic device.

17. The system according to claim 11, wherein the manufacturing information includes at least any one of a type of the electronic device, a manufacturing process of the electronic device, an inspection apparatus used for inspection of the electronic device, and a period in which the electronic device is manufactured.

18. The system according to claim 1, wherein
the electronic device is a semiconductor device, and
the substrate is a wafer.

19. A manufacturing supporting method for an electronic device comprising:
acquiring, on the basis of specific information for specifying a target electronic device, from an inspection database that stores a plurality of inspection data including information concerning dimensions acquired in an inspection process and the specific information, the inspection data of the target electronic device;

calculating, on the basis of the inspection data of the target electronic device, by classification including at least any one of positions among lots, among substrates, and in a substrate plane of the electronic device, fluctuation in dimensions of the target electronic device;

acquiring, from a knowledge database that stores a plurality of improvement history data including information concerning a type of the electronic device, information concerning a manufacturing process in the type, information concerning fluctuation factors of a dimension of a measurement and other properties planned in past by the classification for the manufacturing process, and information concerning a plurality of improvement measures for each of the fluctuation factors, the improvement history data of the target electronic device on the basis of the specific information; and determining a fluctuation factor of the measurement and the other properties of the target electronic device on the basis of information concerning the fluctuation factors of the dimension of the measurement and the other properties included in the improvement history data of the target electronic device, calculating fluctuation in dimensions by the determined fluctuation factor of the measurement and the other properties, and determining a plurality of improvement measures for the target electronic device on the basis of the information concerning the plurality of improvement measures included in the improvement history data.

20. A non-transitory computer readable medium storing manufacturing supporting program for an electronic device for causing a computer to execute:
processing for acquiring, on the basis of specific information for specifying a target electronic device, from an inspection database that stores a plurality of inspection data including information concerning dimensions acquired in an inspection process and the specific information, the inspection data of the target electronic device;

processing for calculating, on the basis of the inspection data of the target electronic device, by classification including at least any one of positions among lots, among substrates, and in a substrate plane of the electronic device, fluctuation in dimensions of the target electronic device;

processing for acquiring, from a knowledge database that stores a plurality of improvement history data including information concerning a type of the electronic device, information concerning a manufacturing process in the type, information concerning fluctuation factors of a dimension of a measurement and other properties planned in past by the classification for the manufacturing process, and information concerning a plurality of improvement measures for each of the fluctuation factors, the improvement history data of the target electronic device on the basis of the specific information; and processing for determining a fluctuation factor of the measurement and the other properties of the target electronic device on the basis of information concerning the fluctuation factors of the dimension of the measurement and the other properties included in the improvement history data of the target electronic device, calculating fluctuation in dimensions by the determined fluctuation factor of the measurement and the other properties, and determining a plurality of improvement measures for the target electronic device on the basis of the information concerning the plurality of improvement measures included in the improvement history data.

* * * * *